(12) United States Patent
Tran et al.

(10) Patent No.: US 11,449,741 B2
(45) Date of Patent: Sep. 20, 2022

(54) TESTING CIRCUITRY AND METHODS FOR ANALOG NEURAL MEMORY IN ARTIFICIAL NEURAL NETWORK

(71) Applicant: Silicon Storage Technology, Inc., San Jose, CA (US)

(72) Inventors: Hieu Van Tran, San Jose, CA (US); Thuan Vu, San Jose, CA (US); Stephen Trinh, San Jose, CA (US); Stanley Hong, San Jose, CA (US); Anh Ly, San Jose, CA (US); Steven Lemke, Boulder Creek, CA (US); Nha Nguyen, San Jose, CA (US); Vipin Tiwari, Dublin, CA (US); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 518 days.

(21) Appl. No.: 16/569,647

(22) Filed: Sep. 12, 2019

(65) Prior Publication Data
US 2021/0019608 A1    Jan. 21, 2021

Related U.S. Application Data

(60) Provisional application No. 62/876,515, filed on Jul. 19, 2019.

(51) Int. Cl.
| | | |
|---|---|---|
| *G06N 3/063* | (2006.01) | |
| *G06N 3/04* | (2006.01) | |
| *G11C 16/04* | (2006.01) | |
| *G11C 16/10* | (2006.01) | |
| *G11C 16/34* | (2006.01) | |
| *G11C 16/08* | (2006.01) | |

(52) U.S. Cl.
CPC ............. *G06N 3/0635* (2013.01); *G06N 3/04* (2013.01); *G11C 16/0425* (2013.01); *G11C 16/10* (2013.01); *G11C 16/3459* (2013.01); *G11C 16/08* (2013.01)

(58) Field of Classification Search
CPC .... G06N 3/0635; G06N 3/04; G11C 16/0425; G11C 16/10; G11C 16/3459; G11C 16/08; G11C 11/54; G11C 2029/2602; G11C 29/50004; G11C 2029/5006
See application file for complete search history.

(56) References Cited

U.S. PATENT DOCUMENTS

| | | |
|---|---|---|
| 5,029,130 A | 7/1991 | Yeh |
| 5,602,044 A | 2/1997 | Rouy |
| 6,747,310 B2 | 6/2004 | Fan et al. |
| 6,768,685 B1 | 7/2004 | Scheuerlein |
| 9,070,481 B1 | 6/2015 | Ellis |
| 9,449,694 B2 | 9/2016 | Paudel et al. |
| 2006/0098505 A1 | 5/2006 | Cho |

(Continued)

*Primary Examiner* — Tri M Hoang
(74) *Attorney, Agent, or Firm* — DLA Piper LLP US

(57) ABSTRACT

Testing circuitry and methods are disclosed for use with analog neural memory in deep learning artificial neural networks. The analog neural memory comprises one or more arrays of non-volatile memory cells. The testing circuitry and methods can be utilized during sort tests, qualification tests, and other tests to verify programming operations of one or more cells.

8 Claims, 41 Drawing Sheets

(56) References Cited

U.S. PATENT DOCUMENTS

| | | | |
|---|---|---|---|
| 2012/0317460 A1* | 12/2012 | Chilappagari | G11C 29/52 |
| | | | 365/185.05 |
| 2013/0028021 A1 | 1/2013 | Sharon | |
| 2013/0301335 A1 | 11/2013 | Ong | |
| 2017/0075579 A1* | 3/2017 | Haga | G06F 3/0619 |
| 2017/0221583 A1 | 8/2017 | Shin | |
| 2017/0337466 A1 | 11/2017 | Bayat et al. | |
| 2019/0164617 A1 | 5/2019 | Tran et al. | |
| 2019/0205729 A1 | 7/2019 | Tran et al. | |
| 2019/0237142 A1* | 8/2019 | Tran | H01L 29/42328 |
| 2019/0287640 A1* | 9/2019 | Takahashi | G11C 29/52 |
| 2019/0355418 A1* | 11/2019 | Majumdar | G11C 13/0004 |
| 2021/0020255 A1* | 1/2021 | Tran | G06N 3/08 |

\* cited by examiner

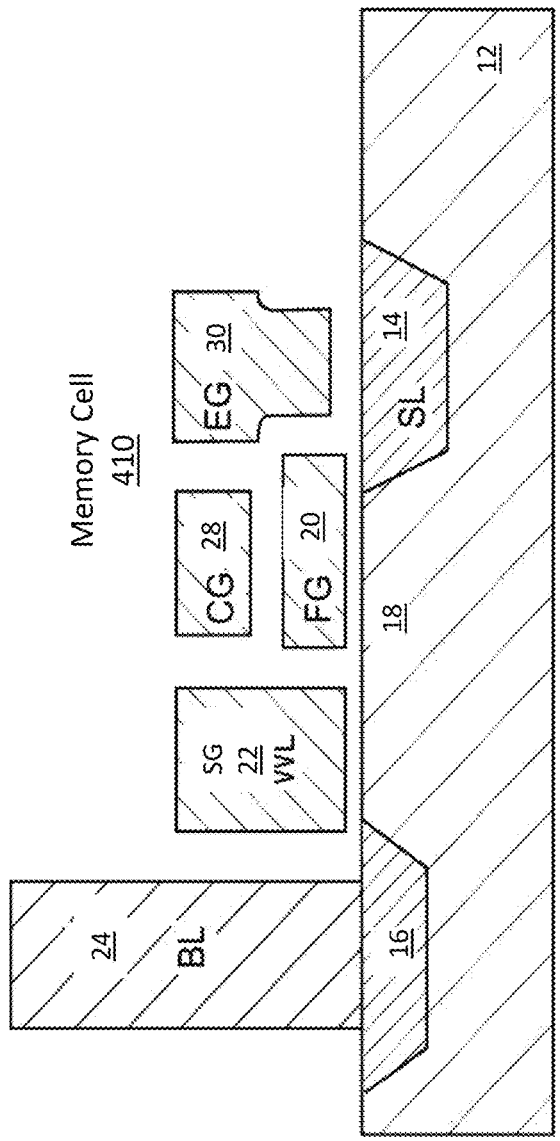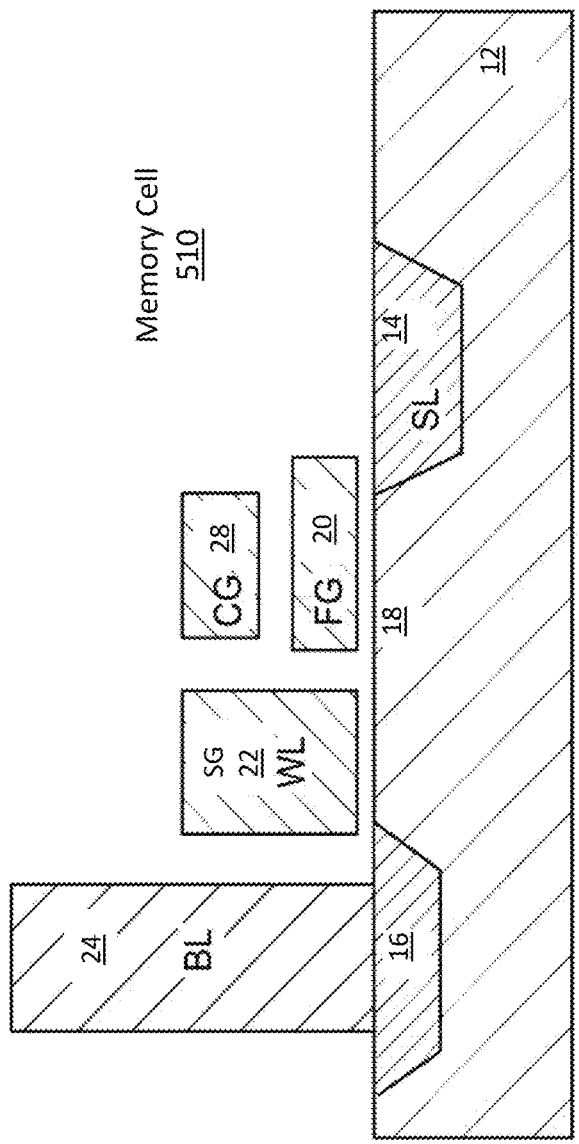
FIGURE 4
(PRIOR ART)
FIGURE 5
(PRIOR ART)

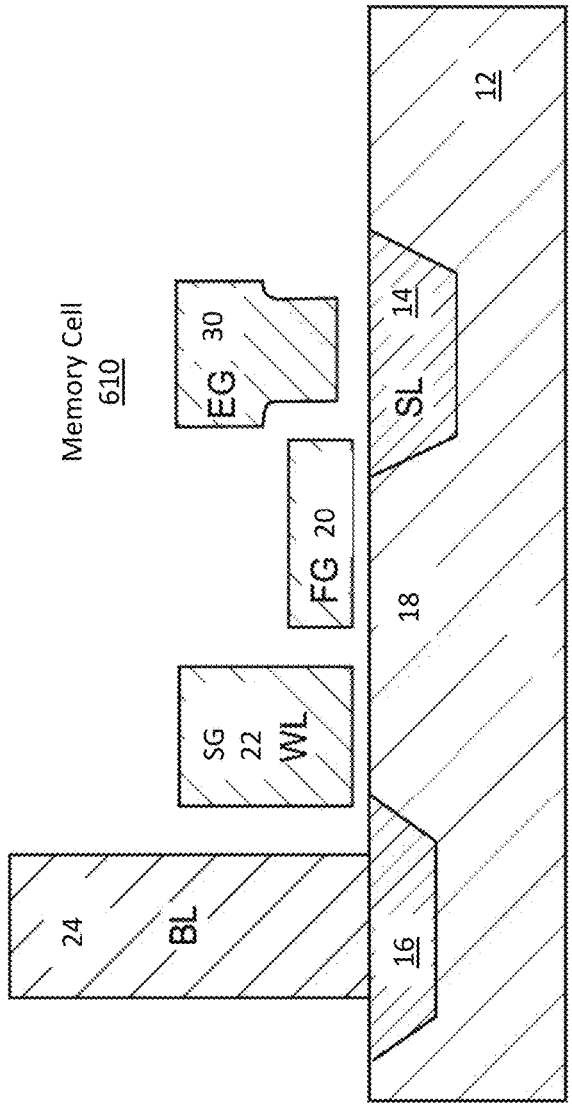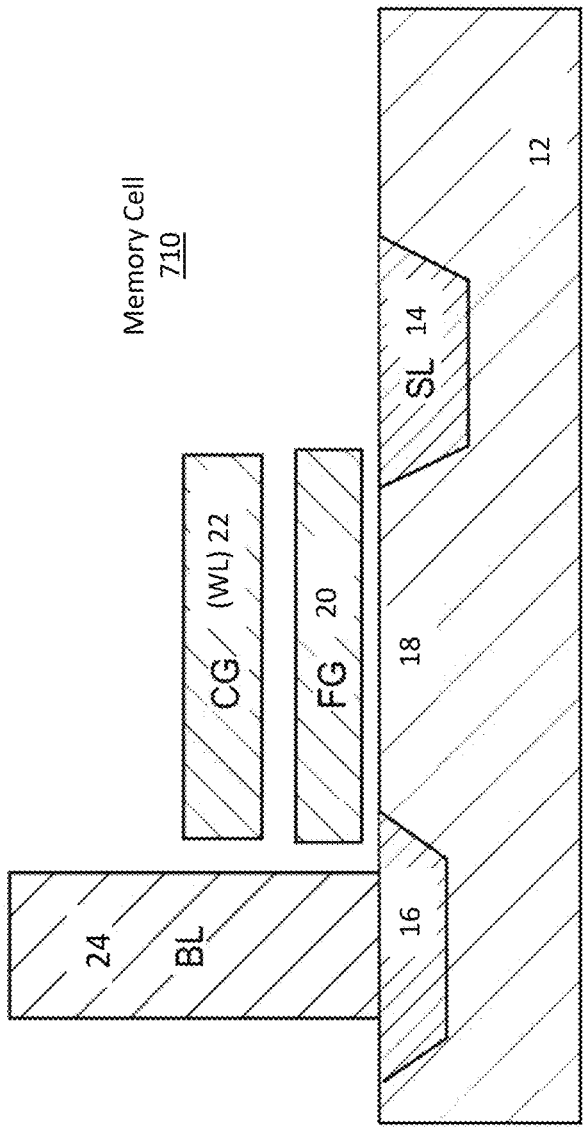
FIGURE 6
(PRIOR ART)
FIGURE 7
(PRIOR ART)

LSB Screen Test
3103

Bitline Sampling Screen Test
3104

3601 measuring voltage $V_{CG}$ by forcing current Iref into the bitline K different times 3602 calculating an average value, $V_{AVG}$, based on the K measured values; and 3603 identifying the bitline as a bad bitline if any of the K measured values is less than $V_{AVG}$ by more than threshold 3604 or is more than $V_{AVG}$ by more than threshold 3605.

Read Window Check Test
3107

Soft Erase Test
3111

4101 erasing the non-volatile memory cells in the array by applying a sequence of voltages on a terminal of each of the non-volatile memory cells in the array, wherein the voltages in the sequence of voltages increase over time in a fixed step size 4102 reading all of the non-volatile memory cells to determine the effectiveness of the erasing step

FIGURE 42

Soft Program Test
3112

4201 programming the non-volatile memory cells in the array by applying a sequence of voltages on a terminal of each non-volatile memory cell in the array, wherein the voltages in the sequence of voltages increase over time in a fixed step size 4202 reading all of the non-volatile memory cells to determine the effectiveness of the programming step

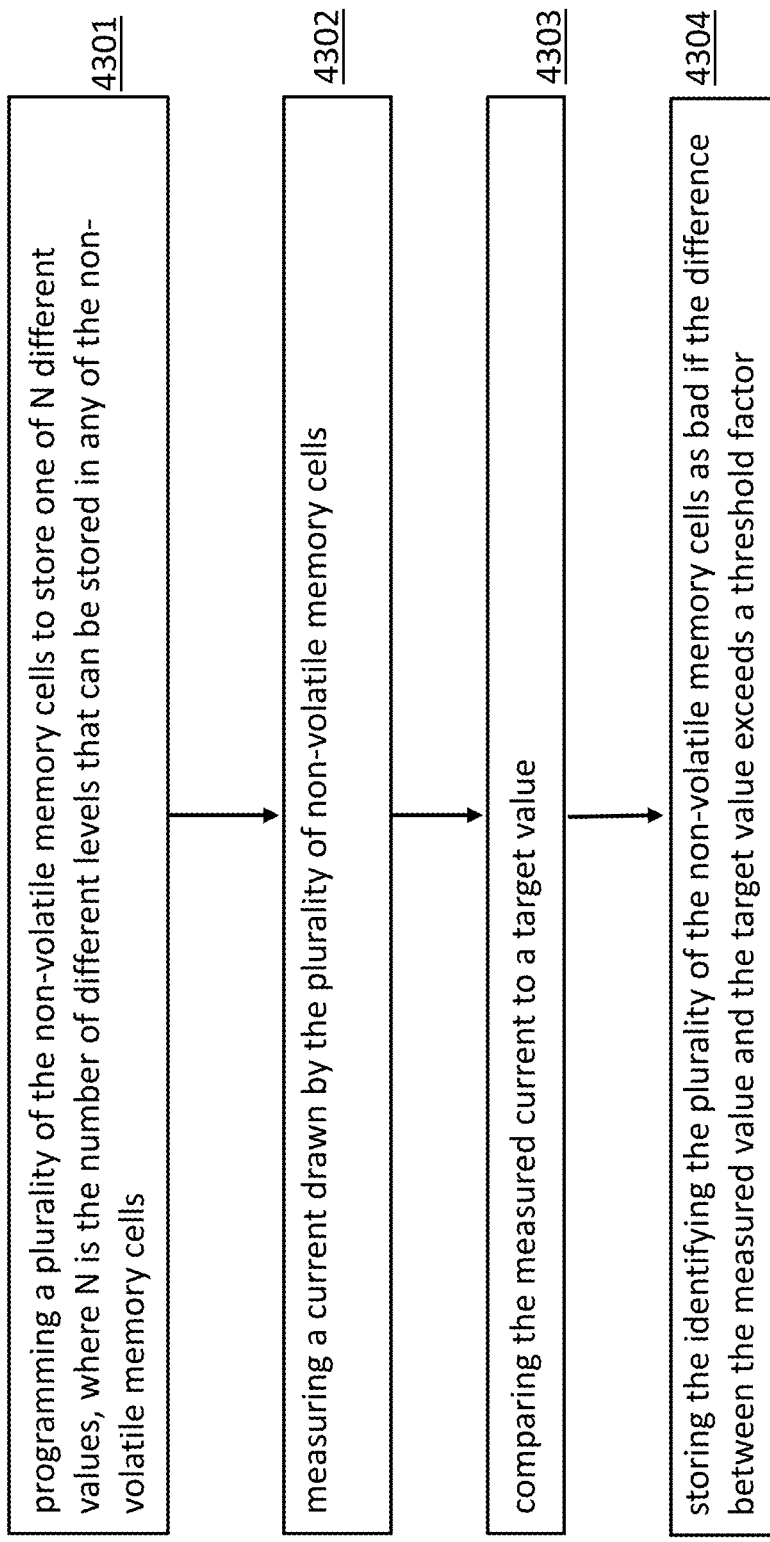

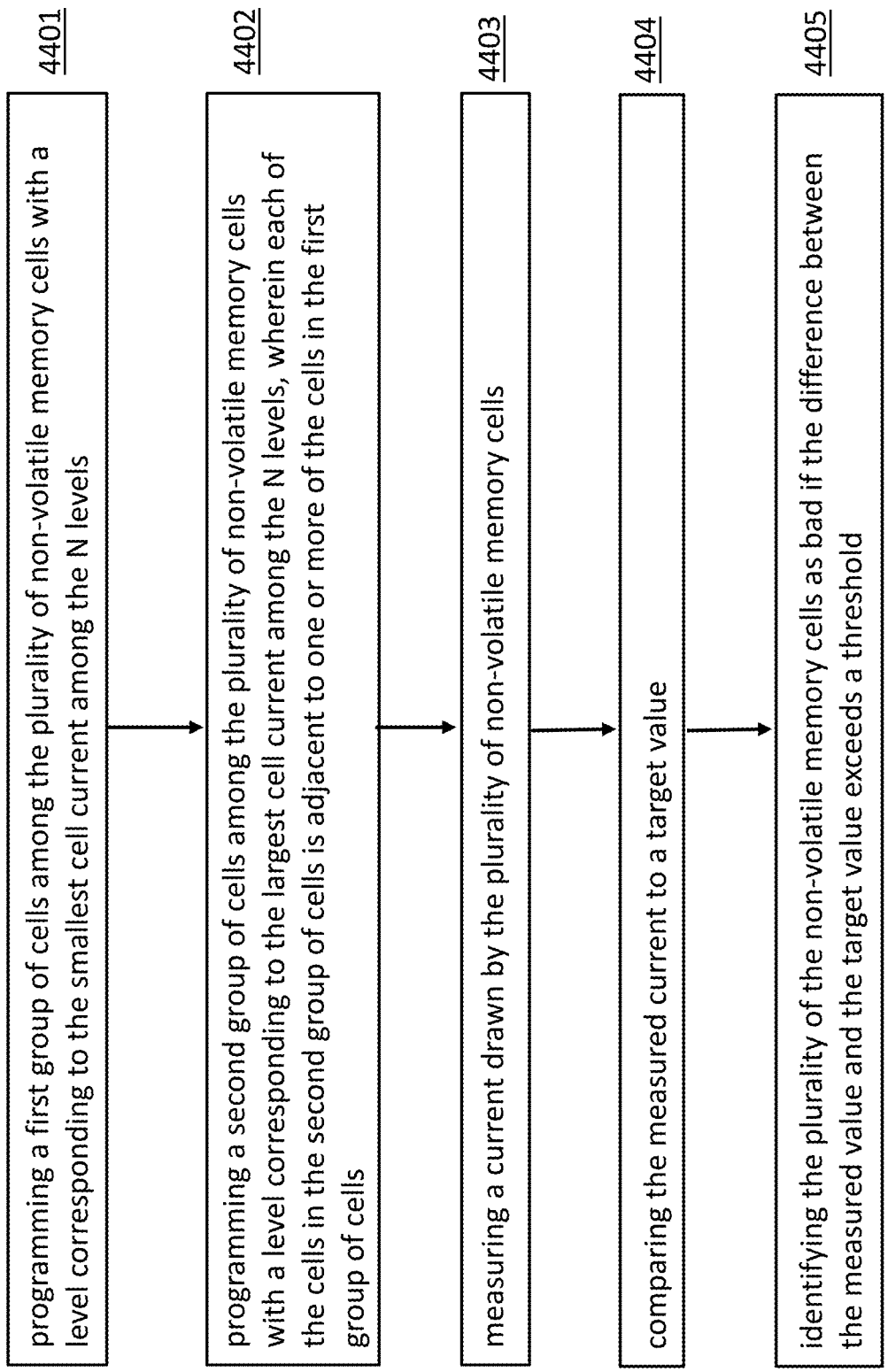

US 11,449,741 B2

TESTING CIRCUITRY AND METHODS FOR ANALOG NEURAL MEMORY IN ARTIFICIAL NEURAL NETWORK

PRIORITY CLAIM

This application claims priority from U.S. Provisional Patent Application No. 62/876,515, filed on Jul. 19, 2019, and titled, "Testing Circuitry and Methods for Analog Neural Memory in Artificial Neural Network," which is incorporated by reference herein.

FIELD OF THE INVENTION

Testing circuitry and methods are disclosed for use with analog neural memory in deep learning artificial neural networks. The analog neural memory comprises one or more arrays of non-volatile flash memory cells.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses required.

Applicant previously disclosed an artificial (analog) neural network that utilizes one or more non-volatile memory arrays as the synapses in U.S. patent application Ser. No. 15/594,439, published as US Patent Publication No. 2017/0337466, which is incorporated by reference. The non-volatile memory arrays operate as an analog neural memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs. An array of memory cells used in this manner can be referred to as a vector by matrix multiplication (VMM) array.

Each non-volatile memory cells used in the analog neural memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

Precision and accuracy are extremely important in operations involving VMM arrays, as each individual memory cell can store one of N different levels, where N can be greater than 2, as opposed to a traditional memory cell where N is always 2. This makes testing an extremely important operation. For example, verification of a programming operation is required to ensure that each individual cell or a column of cells is accurately programmed to the desired value. As another example, it is critical to identify bad cells or groups of cells so that they can be removed from the set of cells used to store data during operation of the VMM array.

What is needed are improved testing circuits and methods for use with VMM arrays.

SUMMARY OF THE INVENTION

Testing circuitry and methods are disclosed for use with analog neural memory in deep learning artificial neural networks. The analog neural memory comprises one or more arrays of non-volatile flash memory cells. The testing circuitry and methods can be utilized during sort tests, cycling tests, high temperature operating life (HTOL) tests, qualification tests, and other tests and to verify the characteristics and operability of one or more cells.

One embodiment comprises a method of verifying values programmed into a plurality of non-volatile memory cells in an array of analog neural non-volatile memory cells, wherein the array is arranged in rows and columns, wherein each row is coupled to a word line and each column is coupled to a bit line, and wherein each word line is selectively coupled to a row decoder and each bit line is selectively coupled to a column decoder, the method comprising: asserting, by the row decoder, all word lines in the array; asserting, by the column decoder, a bit line in the array; sensing, by a sense amplifier, a current received from the bit line; and comparing the current to a reference current to determine if the non-volatile memory cells coupled to the bit line contain the desired values.

Another embodiment comprises a method of measuring current drawn by a plurality of non-volatile memory cells in an array of analog neural non-volatile memory cells, wherein the array is arranged in rows and columns, wherein each row is coupled to a word line and each column is coupled to a bit line, and wherein each word line is selectively coupled to a row decoder and each bit line is selectively coupled to a column decoder, the method comprising:

asserting, by the row decoder, all word lines in the array; asserting, by the column decoder, a bit line in the array; and measuring a current received from the bit line.

Another method comprises a method of testing a plurality of analog neural non-volatile memory cells in an array of non-volatile memory cells, wherein the array is arranged in rows and columns, wherein each row is coupled to a word line and each column is coupled to a bit line, and wherein each word line is selectively coupled to a row decoder and each bit line is selectively coupled to a column decoder, the method comprising: asserting, by the row decoder, all word lines in the array; asserting, by the column decoder, all bit lines in the array; performing a deep programming operation on all non-volatile memory cells in the array; and measuring a total current received from the bit lines.

Another embodiment comprises a method of testing an array of analog neural non-volatile memory cells, wherein the array is arranged in rows and columns, wherein each row is coupled to a word line and each column is coupled to a bitline, the method comprising: programming a plurality of cells coupled to a bitline; measuring, K different times, a current drawn by the plurality of cells and storing a measured value each of the K different times, where K is an integer; calculating an average value based on the K measured values; and identifying the bitline as a bad bitline if any of the K measured values is less than the average value by more than a first threshold or is more than the average value by more than a second threshold.

Another embodiment comprises a method of testing an array of analog neural non-volatile memory cells, wherein the array is arranged in rows and columns, wherein each row is coupled to a word line and each column is coupled to a bitline, the method comprising: programming a plurality of cells coupled to a bitline; measuring, K different times, a voltage on a control gate line coupled to a control gate terminal of a plurality of cells and storing a measured value each of the K different times, where K is an integer; calculating an average value based on the K measured values; and identifying the bitline as a bad bitline if any of the K measured values is less than the average value by more than a first threshold or is more than the average value by more than a second threshold.

Another embodiment comprises a method of testing an analog neural non-volatile memory cell for storing N different values, where N is an integer, the method comprising: programming the cell to a target value representing one of the N values; verifying that the value stored in the cell is within an acceptable window of values around the target value; repeating the programming and reading steps for each of the N values; and identifying the cell as bad if any of the verifying steps indicates a value stored in the cell outside of the acceptable window of values around the target value.

Another embodiment comprises a method of compensating for leakage in an array of analog neural non-volatile memory cells, wherein the array is arranged in rows and columns, wherein each row is coupled to a word line and each column is coupled to a bitline, the method comprising: measuring leakage for a column of non-volatile memory cells coupled to a bitline; storing the measured leakage value; and applying the measured leakage value during a read operation of the column of non-volatile memory cells to compensate for the leakage.

Another embodiment comprises a method of testing a selected non-volatile memory cell in an array of analog neural non-volatile memory cells, the method comprising: determining a logarithmic slope factor for the selected non-volatile memory cell while the selected non-volatile memory cell is operating in a sub-threshold region; storing the logarithmic slope factor; determining a linear slope factor for the selected non-volatile memory cell while the selected non-volatile memory cell is operating in a linear region; storing the linear slope factor; and utilizing one or more of the logarithmic slope factor and the linear slope factor when programming the selected cell to a target current.

Another embodiment comprises a method of measuring current drawn by a column of non-volatile memory cells in an array of analog neural non-volatile memory cells, wherein the array is arranged in rows and columns, wherein each row is coupled to a word line and each column is coupled to a bit line, and wherein each word line is selectively coupled to a row decoder and each bit line is selectively coupled to a column decoder, the method comprising: asserting, by the row decoder, all word lines in the array; asserting, by the column decoder, a bit line in the array to select a column of non-volatile memory cells; and measuring a current received from the bit line.

Another embodiment comprises a method of testing an array of analog neural non-volatile memory cells, the method comprising: erasing the non-volatile memory cells in the array by applying a sequence of voltages on a terminal of each of the non-volatile memory cells in the array, wherein the voltages in the sequence of voltages increase over time in a fixed step size; and reading all of the non-volatile memory cells to determine the effectiveness of the erasing step.

Another embodiment comprises a method of testing an array of analog neural non-volatile memory cells, the method comprising: programming the non-volatile memory cells in the array by applying a sequence of voltages on a terminal of each non-volatile memory cell in the array, wherein the voltages in the sequence of voltages increase over time in a fixed step size; and reading all of the non-volatile memory cells to determine the effectiveness of the programming step.

Another embodiment comprises a method of testing a plurality of analog neural non-volatile memory cells in an array of non-volatile memory cells, wherein the array is arranged in rows and columns, wherein each row is coupled to a word line and each column is coupled to a bit line, and wherein each word line is selectively coupled to a row decoder and each bit line is selectively coupled to a column decoder, the method comprising: programming a plurality of the non-volatile memory cells to store one of N different values, where N is the number of different levels that can be stored in any of the non-volatile memory cells; measuring a current drawn by the plurality of non-volatile memory cells; comparing the measured current to a target value; and identifying the plurality of the non-volatile memory cells as bad if the difference between the measured value and the target value exceeds a threshold.

Another embodiment comprises a method of testing a plurality of analog neural non-volatile memory cells in an array of non-volatile memory cells, wherein the memory array is arranged in rows and columns, wherein each row is coupled to a word line and each column is coupled to a bit line, and wherein each word line is selectively coupled to a row decoder and each bit line is selectively coupled to a column decoder, the method comprising: programming a first selection of cells among the plurality of non-volatile memory cells with a level corresponding to the smallest cell current among the N levels; programming a second selection of cells among the plurality of non-volatile memory cells with a level corresponding to the largest cell current among the N levels, wherein each of the cells in the second selection of cells is adjacent to one or more of the cells in the first selection of cells; measuring a current drawn by the plurality of non-volatile memory cells; comparing the measured current to a target value; and identifying the plurality of the non-volatile memory cells as bad if the difference between the measured value and the target value exceeds a threshold.

BRIEF DESCRIPTION OF THE DRAWINGS

FIG. 4 depicts another prior art split gate flash memory cell.

FIG. 5 depicts another prior art split gate flash memory cell

FIG. 6 depicts another prior art split gate flash memory cell.

FIG. 7 depicts a prior art stacked gate flash memory cell.

FIG. 42 depicts an embodiment of a soft program test.

FIG. 43 depicts an embodiment of a verification test.

FIG. 44 depicts an embodiment of a checkerboard verification test.

DETAILED DESCRIPTION OF THE INVENTION

The artificial neural networks of the present invention utilize a combination of CMOS technology and non-volatile memory arrays.

Non-Volatile Memory Cells

Figure 1:
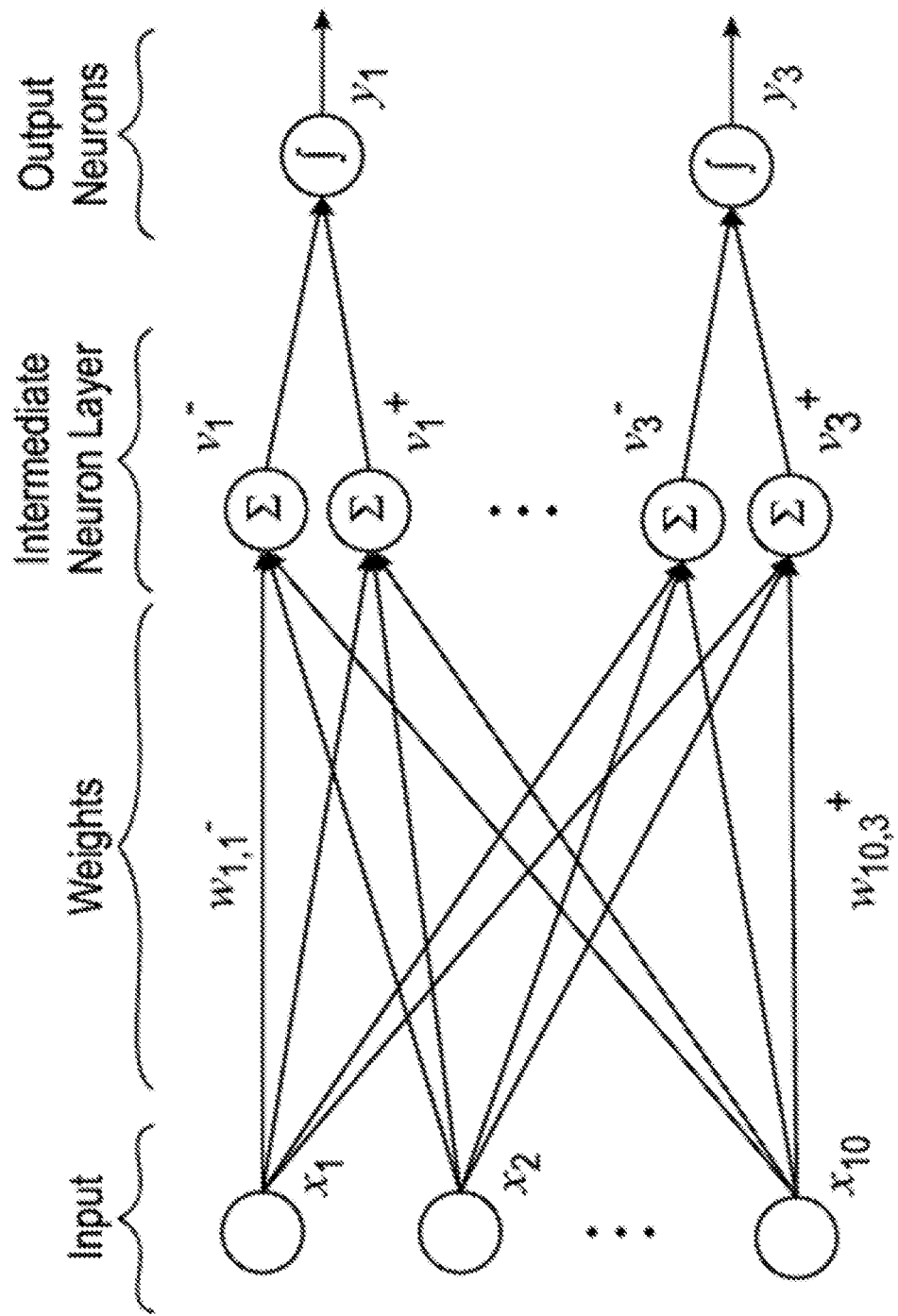
FIG. 1 is a diagram that illustrates a prior art artificial neural network.
Figures 2, 3:
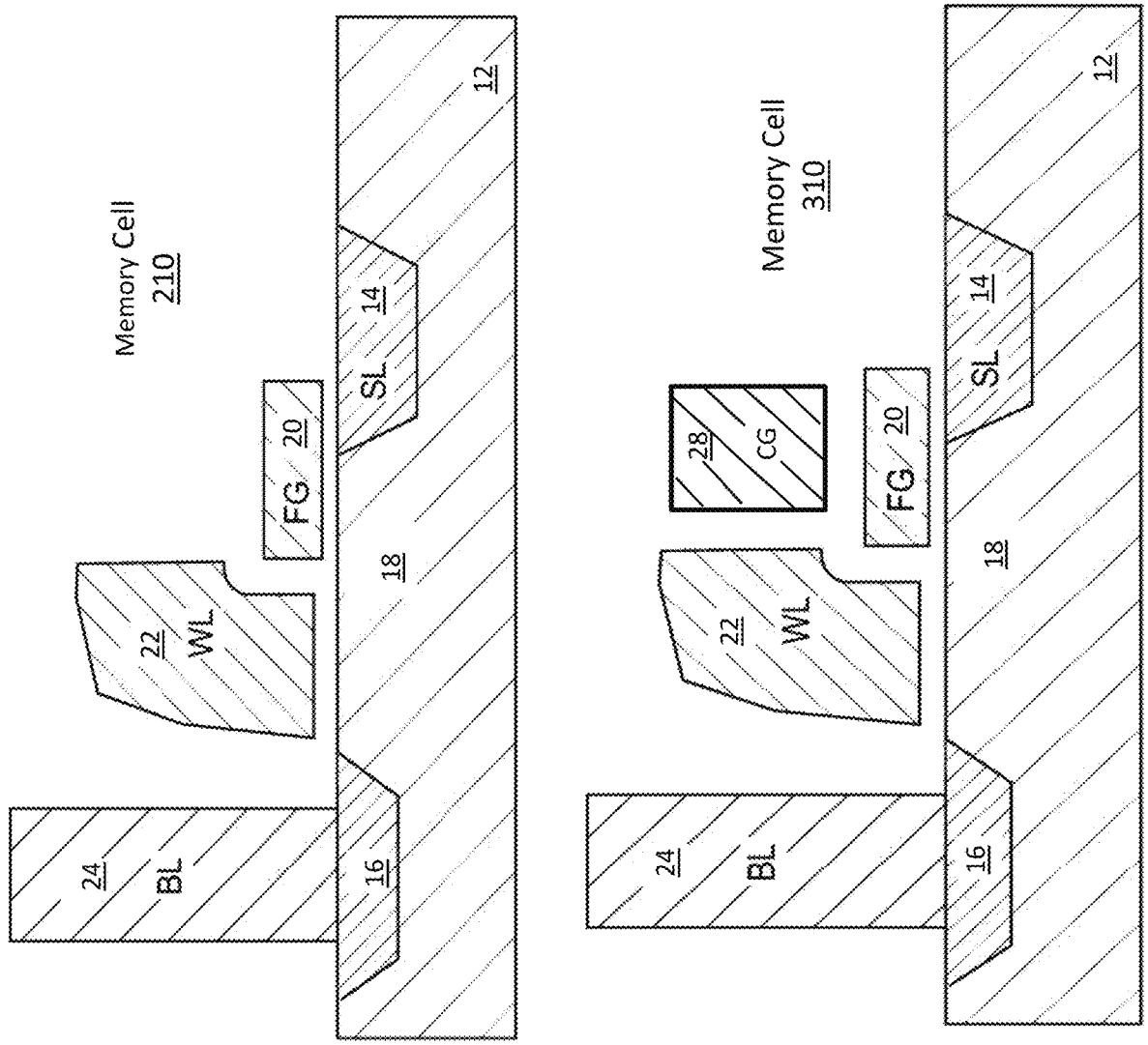
FIG. 2 depicts a prior art split gate flash memory cell.
FIG. 3 depicts another prior art split gate flash memory cell

Digital non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 (source line terminal) towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Operation of Flash Memory Cell 210 of FIG. 2

|  | WL | BL | SL |
|---|---|---|---|
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 µA | 9-10 V |

"Read 1" is a read mode in which the cell current is output on the bit line. "Read 2" is a read mode in which the cell current is output on the source line terminal.

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0v/-8V, low or mid range in read, e.g., 0v/2.5V. Other terminals are biased similarly to that of FIG. 2.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 410 for performing read, erase, and program operations:

TABLE NO. 2

Operation of Flash Memory Cell 410 of FIG. 4

|  | WL/SG | BL | CG | EG | SL |
|---|---|---|---|---|---|
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | -0.5 V/0 V | 0 V | 0 V/-8 V | 8-12 V | 0 V |
| Program | 1 V | 1 µA | 8-11 V | 4.5-9 V | 4.5-5 V |

"Read 1" is a read mode in which the cell current is output on the bit line. "Read 2" is a read mode in which the cell current is output on the source line terminal.

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation is also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

|  | WL/SG | BL | EG | SL |
|---|---|---|---|---|
| Read 1 | 0.5-2.2 V | 0.1-2 V | 0-2.6 V | 0 V |
| Read 2 | 0.5-2.2 V | 0-2 V | 0-2.6 V | 2-0.1 V |
| Erase | -0.5 V/0 V | 0 V | 11.5 V | 0 V |
| Program | 1 V | 2-3 µA | 4.5 V | 7-9 V |

"Read 1" is a read mode in which the cell current is output on the bit line. "Read 2" is a read mode in which the cell current is output on the source line terminal.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

|  | CG | BL | SL | Substrate |
|---|---|---|---|---|
| Read 1 | 0-5 V | 0.1-2 V | 0-2 V | 0 V |
| Read 2 | 0.5-2 V | 0-2 V | 2-0.1 V | 0 V |
| Erase | -8 to -10 V/0 V | FLT | FLT | 8-10 V/15-20 V |
| Program | 8-12 V | 3-5 V/0 V | 0 V/3-5 V | 0 V |

"Read 1" is a read mode in which the cell current is output on the bit line. "Read 2" is a read mode in which the cell current is output on the source line terminal. Optionally, in arrays comprising rows and columns of memory cells 210,

310, 410, 510, 610, or 710, source lines can be coupled to one row of memory cells or to two adjacent rows of memory cells. That is, source line terminals can be shared by adjacent rows of memory cells.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and volatile synapse cell, without limitation.

Neural Networks Employing Non-Volatile Memory Cell Arrays

Figure 8:
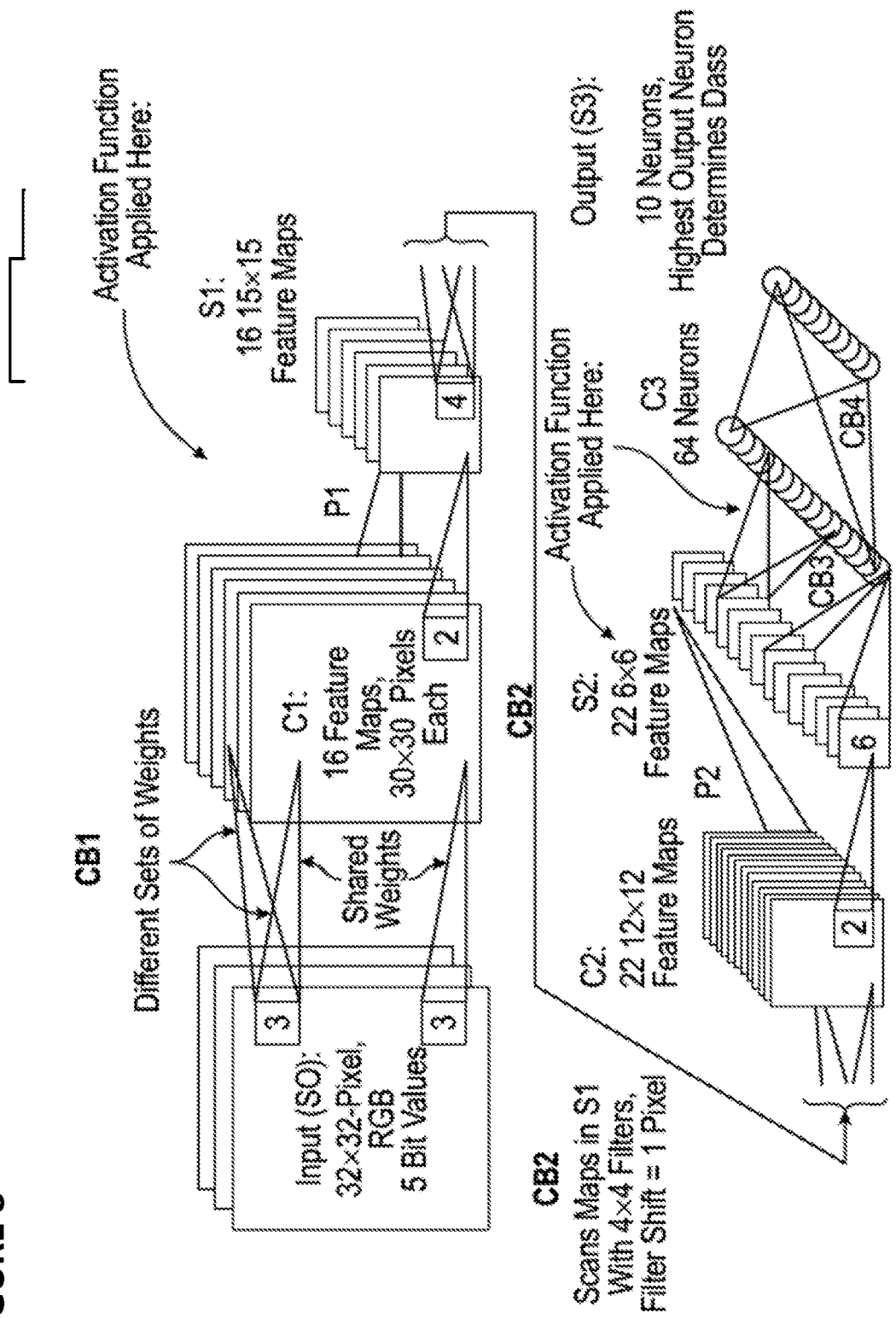
FIG. 8 is a diagram illustrating the different levels of an exemplary artificial neural network utilizing one or more non-volatile memory arrays.

FIG. 8 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 9:
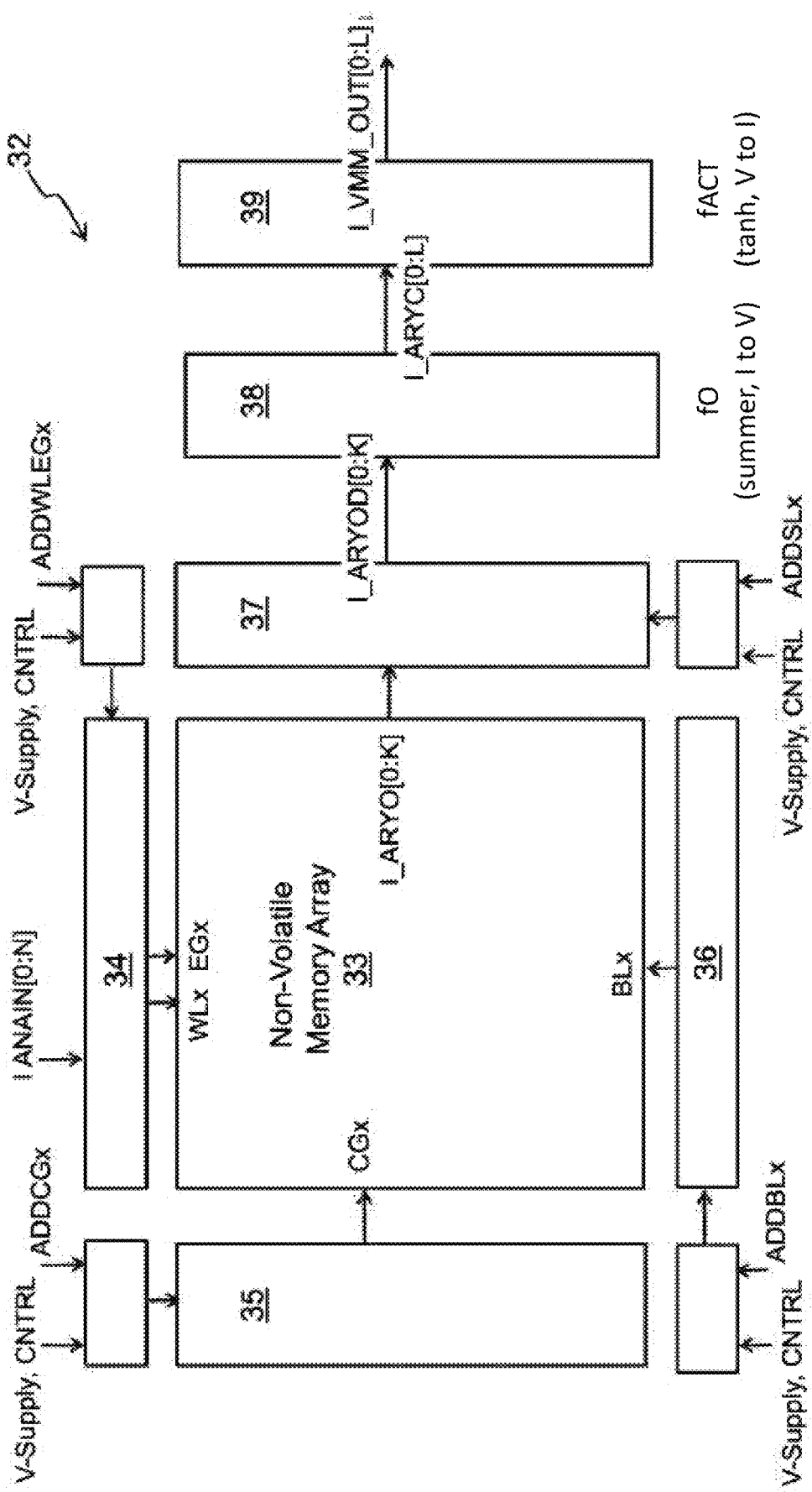
FIG. 9 is a block diagram illustrating a vector-by-matrix multiplication system.

FIG. 9 is a block diagram of a system that can be used for that purpose. Vector-by-matrix multiplication (VMM) system 32 includes non-volatile memory cells and is utilized as the synapses (such as CB1, CB2, CB3, and CB4 in FIG. 6) between one layer and the next layer. Specifically, VMM system 32 includes VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of VMM array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tan h, ReLU functions, or any other non-linear function. The rectified output values of activation function circuit 39 become an element of a feature map of the next layer (e.g. C1 in FIG. 8), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 9 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level, binary level, digital pulses, or digital bits (in which case an output ADC is provided to convert output analog level into digital bits).

Figure 10:
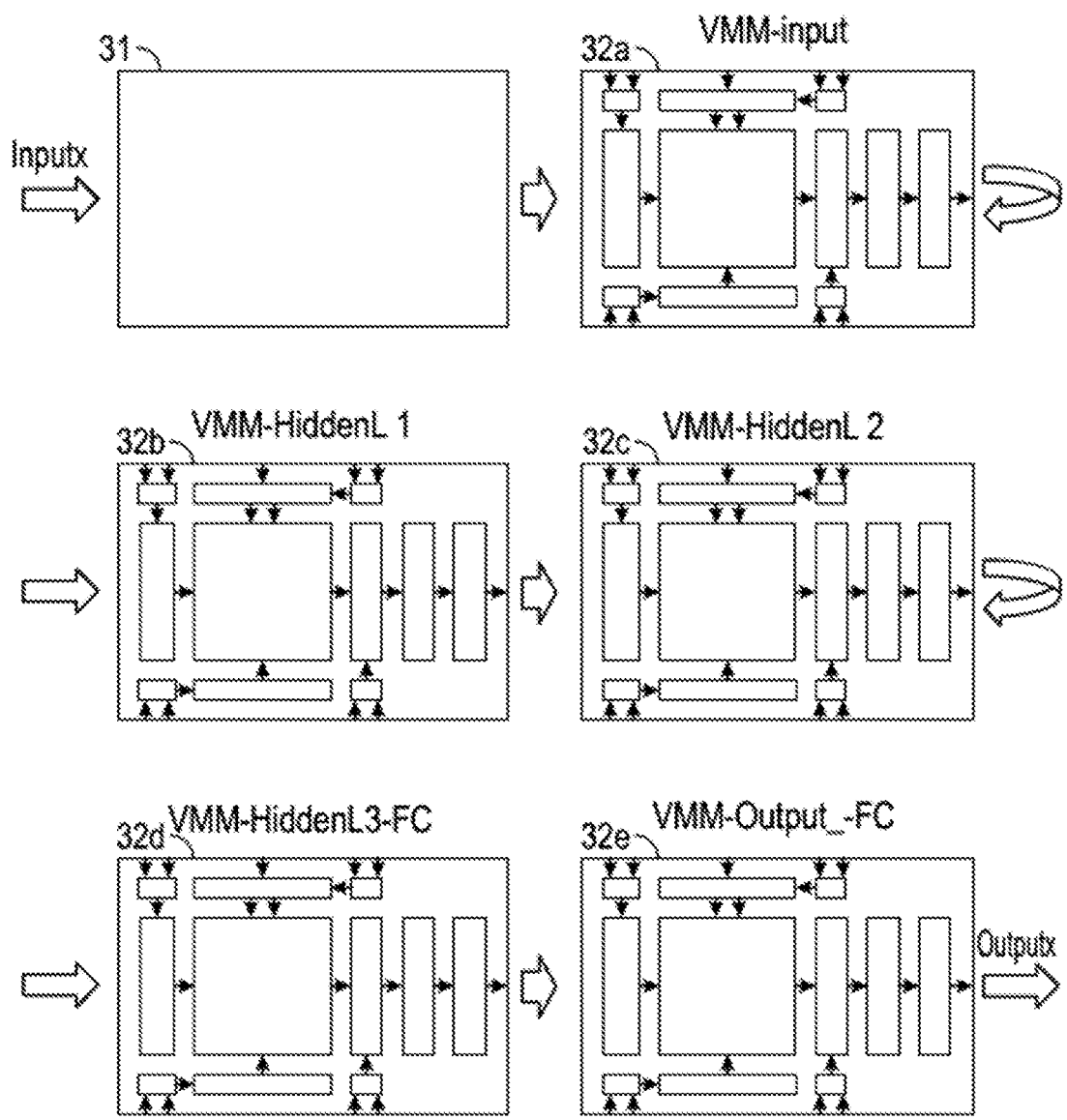
FIG. 10 is a block diagram illustrates an exemplary artificial neural network utilizing one or more a vector-by-matrix multiplication systems.

FIG. 10 is a block diagram depicting the usage of numerous layers of VMM systems 32, here labeled as VMM systems 32a, 32b, 32c, 32d, and 32e. As shown in FIG. 10, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical system comprising a respective non-volatile memory array, or multiple VMM systems could utilize different portions of the same physical non-volatile memory array, or multiple VMM systems could utilize overlapping portions of the same physical non-volatile memory array. Each VMM system 32a, 32b, 32c, 32d, and 32e can also be time multiplexed for various portion of its array or neurons. The example shown in FIG. 10 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

VMM Arrays

Figure 11:
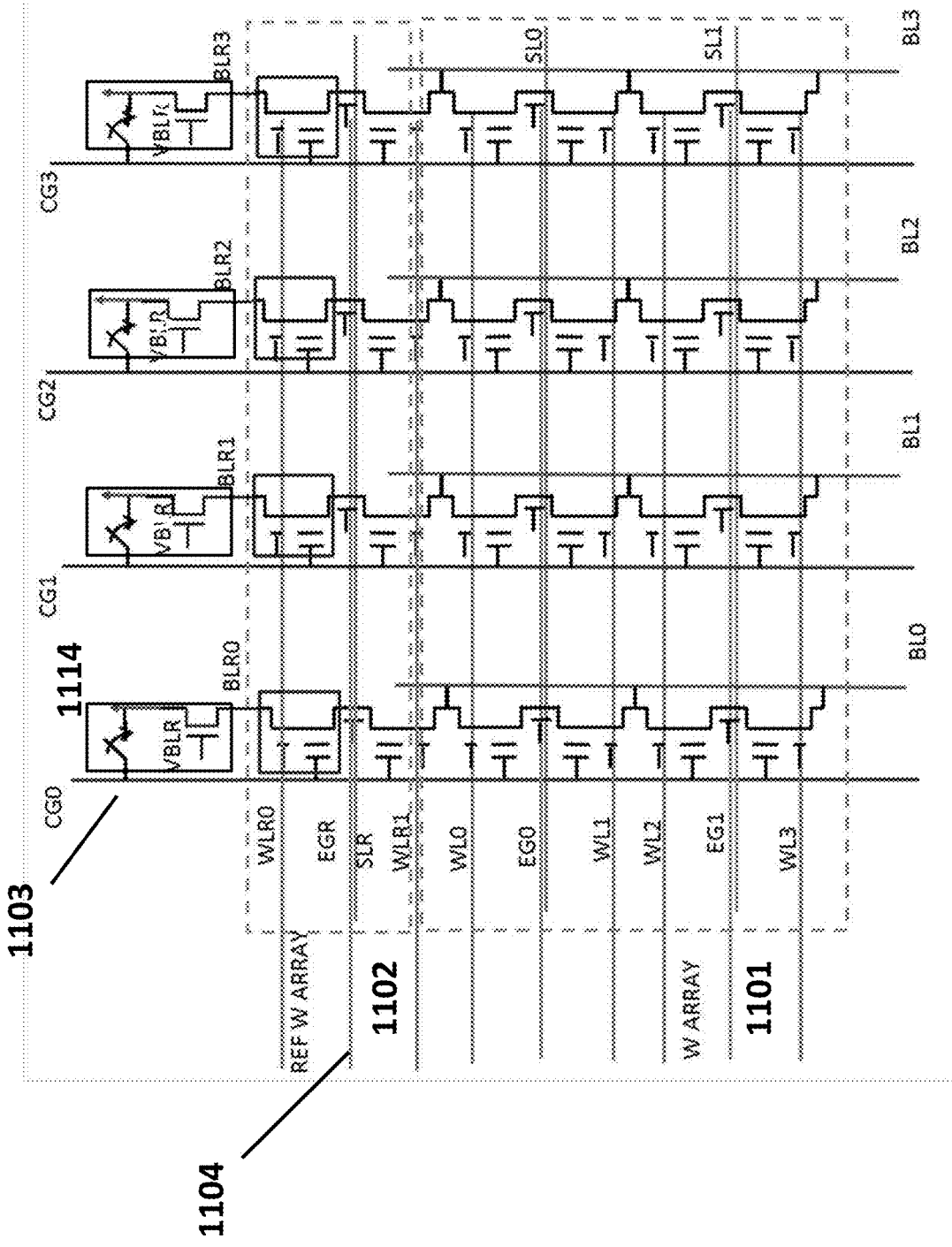
FIG. 11 depicts another embodiment of a vector-by-matrix multiplication system.

FIG. 11 depicts neuron VMM array 1100, which is particularly suited for memory cells 310 as shown in FIG. 3, and is utilized as the synapses and parts of neurons between an input layer and the next layer. VMM array 1100 comprises memory array 1101 of non-volatile memory cells and reference array 1102 (at the top of the array) of non-volatile reference memory cells. Alternatively, another reference array can be placed at the bottom.

In VMM array 1100, control gate lines, such as control gate line 1103, run in a vertical direction (hence reference array 1102 in the row direction is orthogonal to control gate line 1103), and erase gate lines, such as erase gate line 1104, run in a horizontal direction. Here, the inputs to VMM array 1100 are provided on the control gate lines (CG0, CG1, CG2, CG3), and the output of VMM array 1100 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1100, i.e. the flash memory of VMM array 1100, are preferably configured to operate in a sub-threshold region.

The non-volatile reference memory cells and the non-volatile memory cells described herein are biased in weak inversion:

$$Ids = Io*e^{(Vg-Vth)/nVt} = w*Io*e^{(Vg)/nVt},$$

where $w = e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg = n*Vt*\log[Ids/wp*Io]$$

Here, wp is w of a reference or peripheral memory cell.

For an I-to-V log converter using a memory cell (such as a reference memory cell or a peripheral memory cell) or a transistor to convert input current Ids, into an input voltage, Vg:

$$Vg=n*Vt*\log [Ids/wp*Io]$$

Here, wp is w of a reference or peripheral memory cell.

For a memory array used as a vector matrix multiplier VMM array, the output current is:

$$Iout=wa*Io*e^{(Vg)/nVt} \text{ namely}$$

$$Iout=(wa/wp)*Iin=W*Iin$$

$$W=e^{(Vthp-Vtha)/nVt}$$

$$Iin=wp*Io*e^{(Vg)/nVt}$$

Here, wa=w of each memory cell in the memory array.

A wordline or control gate can be used as the input for the memory cell for the input voltage.

Alternatively, the non-volatile memory cells of VMM arrays described herein can be configured to operate in the linear region:

$$Ids=\text{beta}*(Vgs-Vth)*Vds; \text{beta}=u*Cox*Wt/L,$$

$$W\alpha(Vgs-Vth),$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the memory cells of VMM arrays described herein can be configured to operate in the saturation region:

$$Ids=\tfrac{1}{2}*\text{beta}*(Vgs-Vth)^2; \text{beta}=u*Cox*Wt/L$$

$$W\alpha(Vgs-Vth)^2, \text{meaning weight } W \text{ is proportional to} (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation).

Other embodiments for VMM array 33 of FIG. 9 are described in U.S. patent application Ser. No. 15/826,345, which is incorporated by reference herein. As described in that application, a sourceline or a bitline can be used as the neuron output (current summation output).

Figure 12:
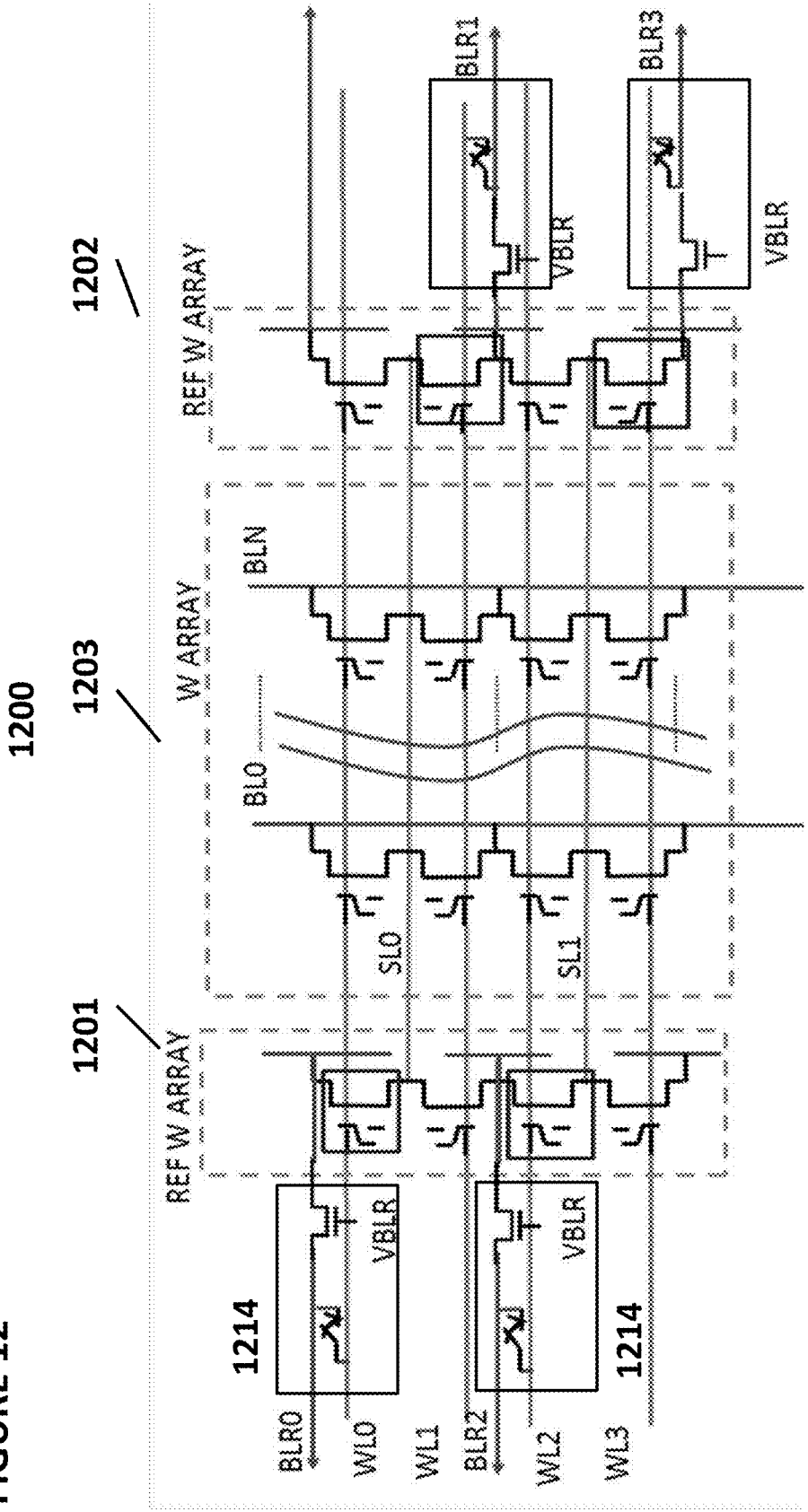
FIG. 12 depicts another embodiment of a vector-by-matrix multiplication system.

FIG. 12 depicts neuron VMM array 1200, which is particularly suited for memory cells 210 as shown in FIG. 2, and is utilized as the synapses between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1214 (only partially depicted) with current inputs flowing into them. The reference cells are tuned (e.g., programmed) to target reference levels. The target reference levels are provided by a reference mini-array matrix (not shown).

Memory array 1203 serves two purposes. First, it stores the weights that will be used by the VMM array 1200 on respective memory cells thereof. Second, memory array 1203 effectively multiplies the inputs (i.e. current inputs provided in terminals BLR0, BLR1, BLR2, and BLR3, which reference arrays 1201 and 1202 convert into the input voltages to supply to wordlines WL0, WL1, WL2, and WL3) by the weights stored in the memory array 1203 and then adds all the results (memory cell currents) to produce the output on the respective bit lines (BL0-BLN), which will be the input to the next layer or input to the final layer. By performing the multiplication and addition function, memory array 1203 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1200. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

TABLE NO. 5

| Operation of VMM Array 1200 of FIG. 12: | | | | | |
|---|---|---|---|---|---|
| WL | WL-unsel | BL | BL-unsel | SL | SL-unsel |
| Read 0.5–3.5 V | −0.5 V/0 V | 0.1-2 V (Ineuron) | 0.6 V-2 V/ FLT | 0 V | 0 V |
| Erase ~5-13 V | 0 V | 0 V | 0 V | 0 V | 0 V |
| Program 1-2 V | −0.5 V/0 V | 0.1-3 uA | Vinh ~2.5 V | 4-10 V | 0-1 V/ FLT |

Figure 13:
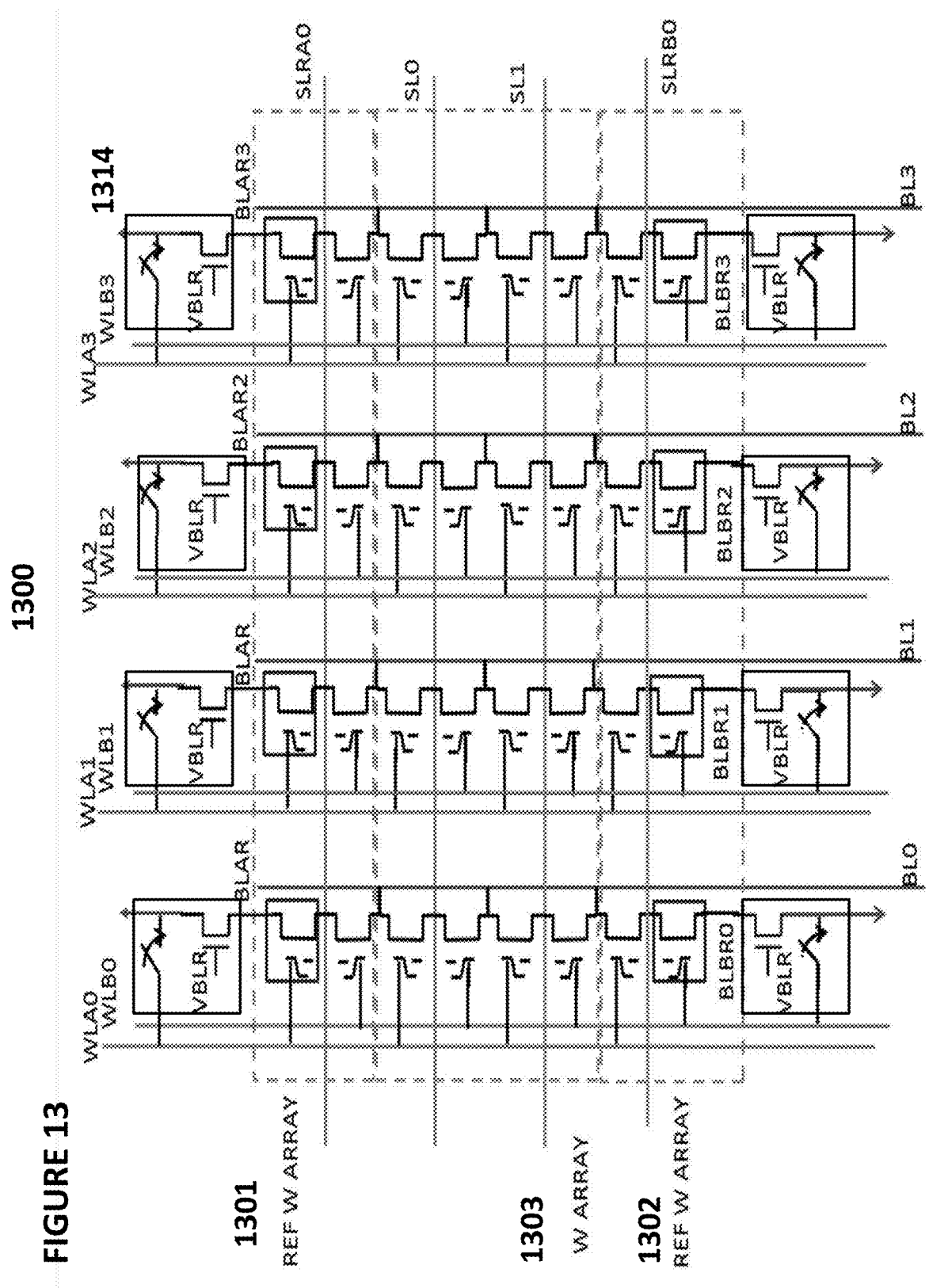
FIG. 13 depicts another embodiment of a vector-by-matrix multiplication system.

FIG. 13 depicts neuron VMM array 1300, which is particularly suited for memory cells 210 as shown in FIG. 2, and is utilized as the synapses and parts of neurons between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302 run in row direction of the VMM array 1300. VMM array is similar to VMM 1000 except that in VMM array 1300, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

Operation of VMM Array 1300 of FIG. 13

| | WL | WL-unsel | BL | BL-unsel | SL | SL-unsel |
|---|---|---|---|---|---|---|
| Read | 0.5-3.5 V | −0.5 V/ 0 V | 0.1-2 V | 0.1 V-2 V/ FLT | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/ 0 V | 0.1-3 uA | Vinh ~2.5 V | 4-10 V | 0-1 V/ FLT |

Figure 14:
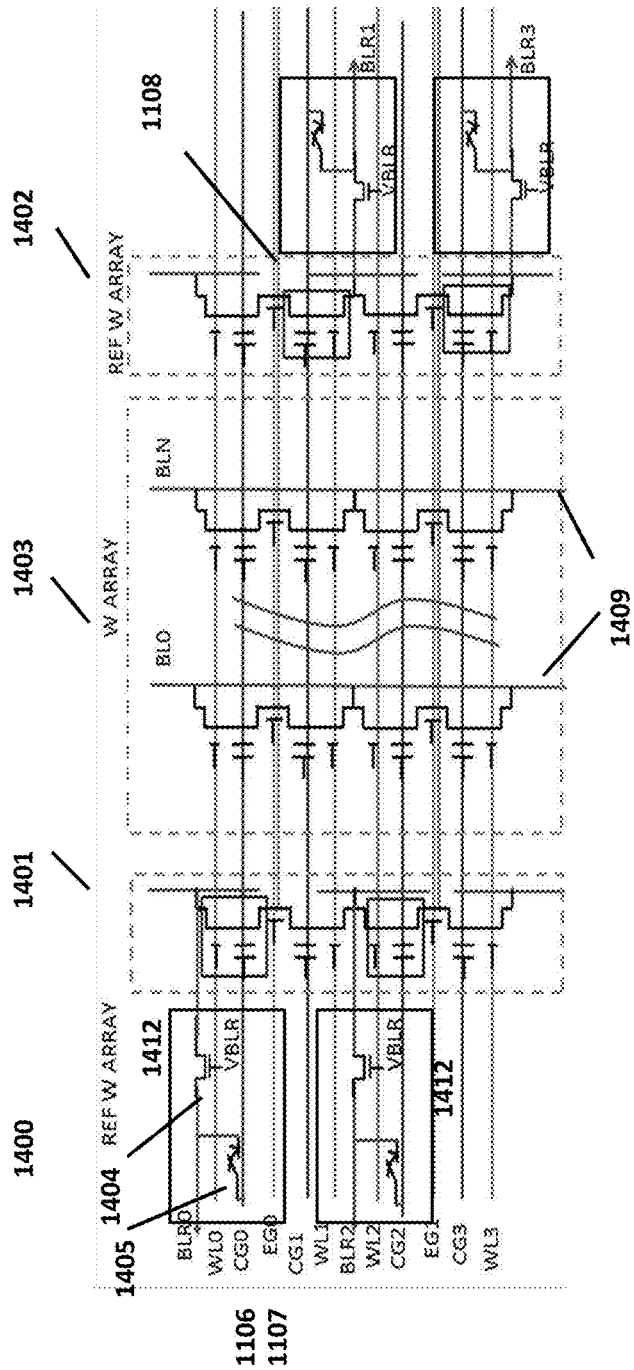
FIG. 14 depicts another embodiment of a vector-by-matrix multiplication system.

FIG. 14 depicts neuron VMM array 1400, which is particularly suited for memory cells 310 as shown in FIG. 3, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1412 (only partially shown) with current inputs flowing into them through BLR0, BLR1, BLR2, and BLR3. Multiplexors 1412 each include a respective multiplexor 1405 and a cascoding transistor 1404 to ensure a constant voltage on the bitline (such as BLR0) of each of the first and second non-volatile reference memory cells during a read operation. The reference cells are tuned to target reference levels.

Memory array 1403 serves two purposes. First, it stores the weights that will be used by the VMM array 1400. Second, memory array 1403 effectively multiplies the inputs (current inputs provided to terminals BLR0, BLR1, BLR2, and BLR3, for which reference arrays 1401 and 1402 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1400 implements uni-directional tuning for non-volatile memory cells in memory array 1403. That is, each non-volatile memory cell is erased and then partially programmed until the desired charge on the floating gate is reached. This can be performed, for example, using the precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

Operation of VMM Array 1400 of FIG. 14

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 0.5-2 V | −0.5 V/0 V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 15:
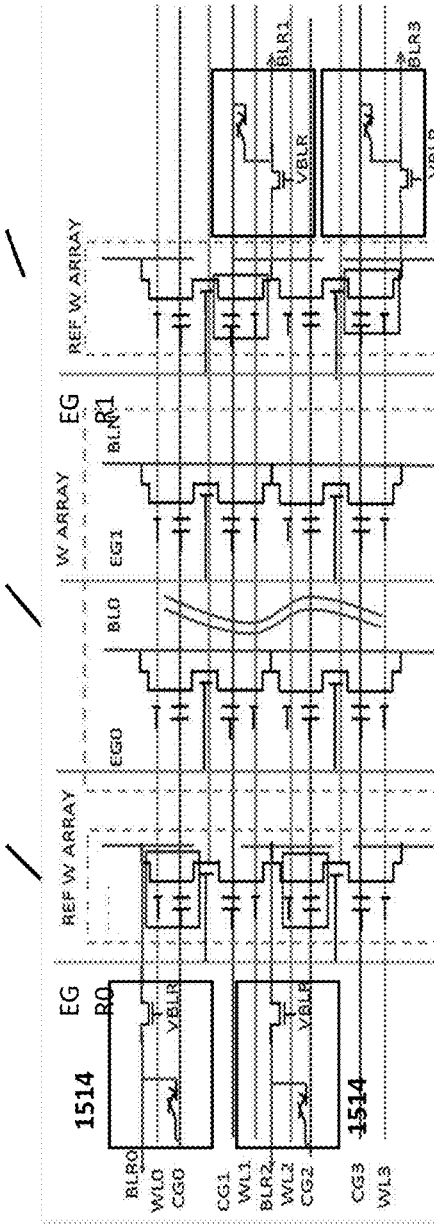
FIG. 15 depicts another embodiment of a vector-by-matrix multiplication system.

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 or first non-volatile reference memory cells, and reference array 1502 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1500 is similar to VMM array 1400, except that VMM array 1500 implements bi-directional tuning, where each individual cell can be completely erased, partially programmed, and partially erased as needed to reach the desired amount of charge on the floating gate due to the use of separate EG lines. As shown, reference arrays 1501 and 1502 convert input current in the terminal BLR0, BLR1, BLR2, and BLR3 into control gate voltages CG0, CG1, CG2, and CG3 (through the action of diode-connected reference cells through multiplexors 1514) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Table No. 8: Operation of VMM Array 1500 of FIG. 15

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V (Ineuron) | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 16:
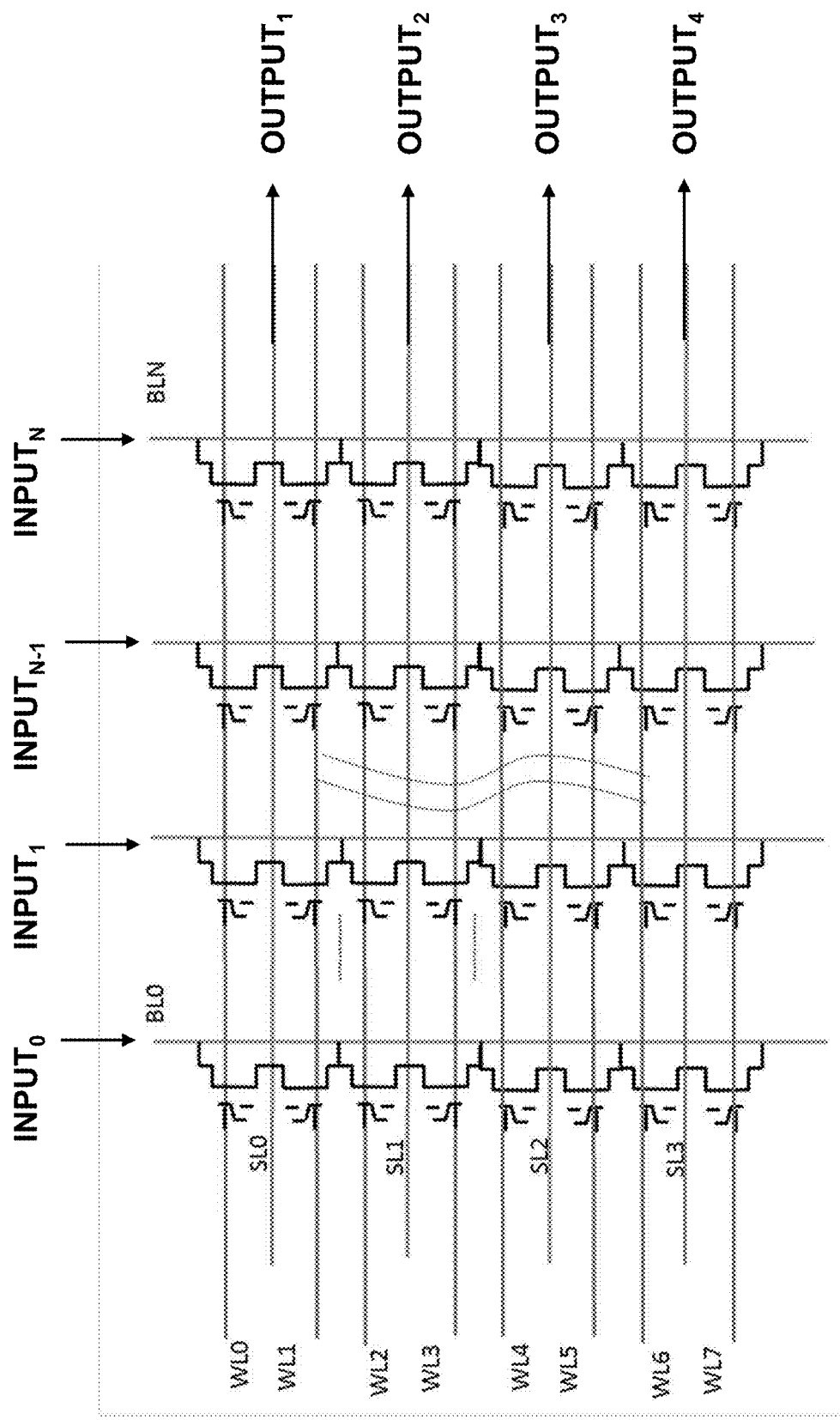
FIG. 16 depicts another embodiment of a vector-by-matrix multiplication system.

FIG. 16 depicts neuron VMM array 1600, which is particularly suited for memory cells 210 as shown in FIG. 2, and is utilized as the synapses and parts of neurons between an input layer and the next layer. In VMM array 1600, the inputs $INPUT_0 \ldots, INPUT_N$ are received on bit lines $BL_0, \ldots BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

Figure 17:
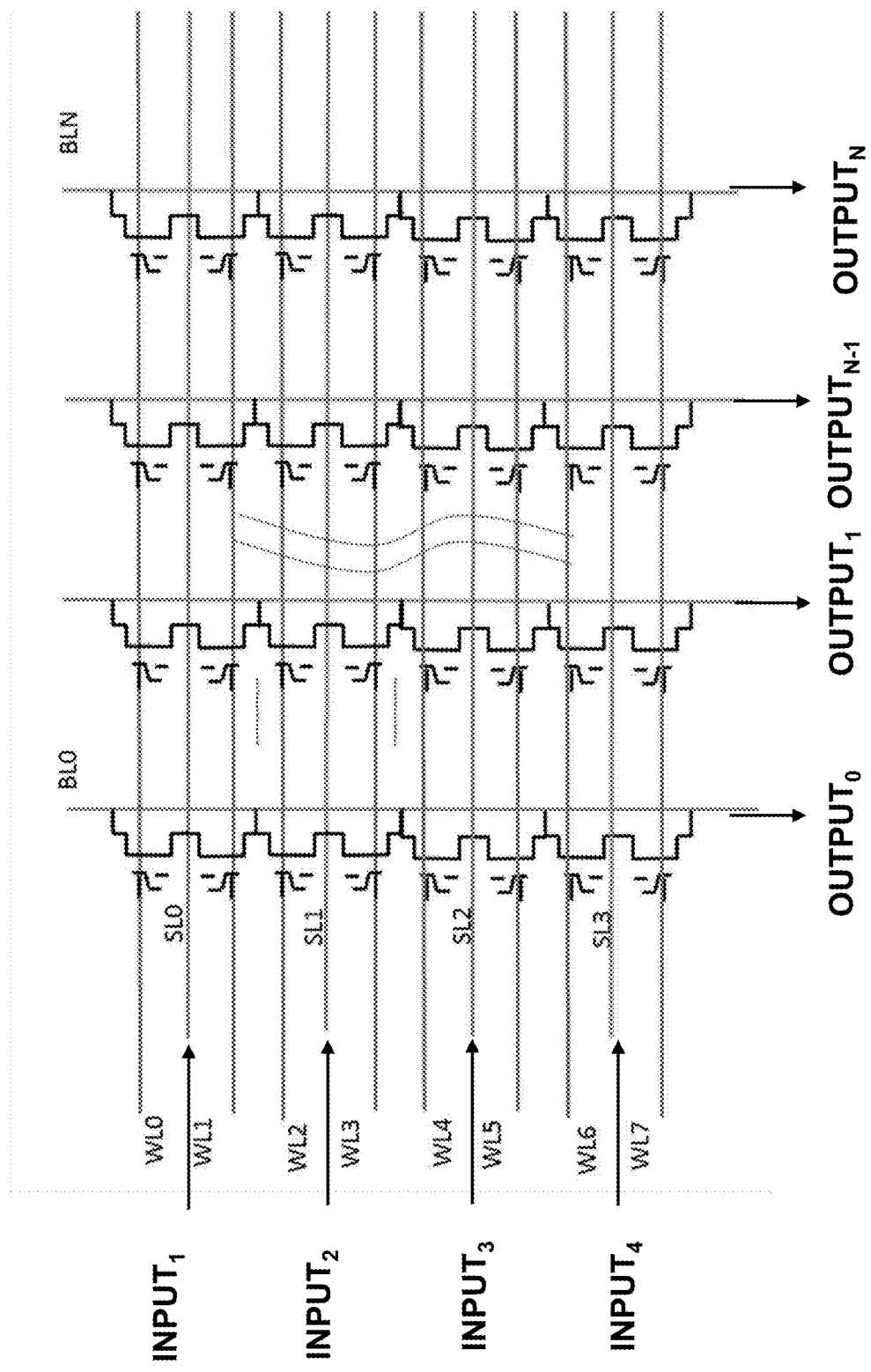
FIG. 17 depicts another embodiment of a vector-by-matrix multiplication system.

FIG. 17 depicts neuron VMM array 1700, which is particularly suited for memory cells 210 as shown in FIG. 2, and is utilized as the synapses and parts of neurons between an input layer and the next layer. In this example, the inputs $INPUT_0$, $INPUT_1$, $INPUT_2$, and INPUTS are received on source lines $SL_0$, $SL_1$, $SL_2$, and $SL_3$, respectively, and the outputs $OUTPUT_0, \ldots OUTPUT_N$ are generated on bit lines $BL_0, \ldots, BL_N$.

Figure 18:
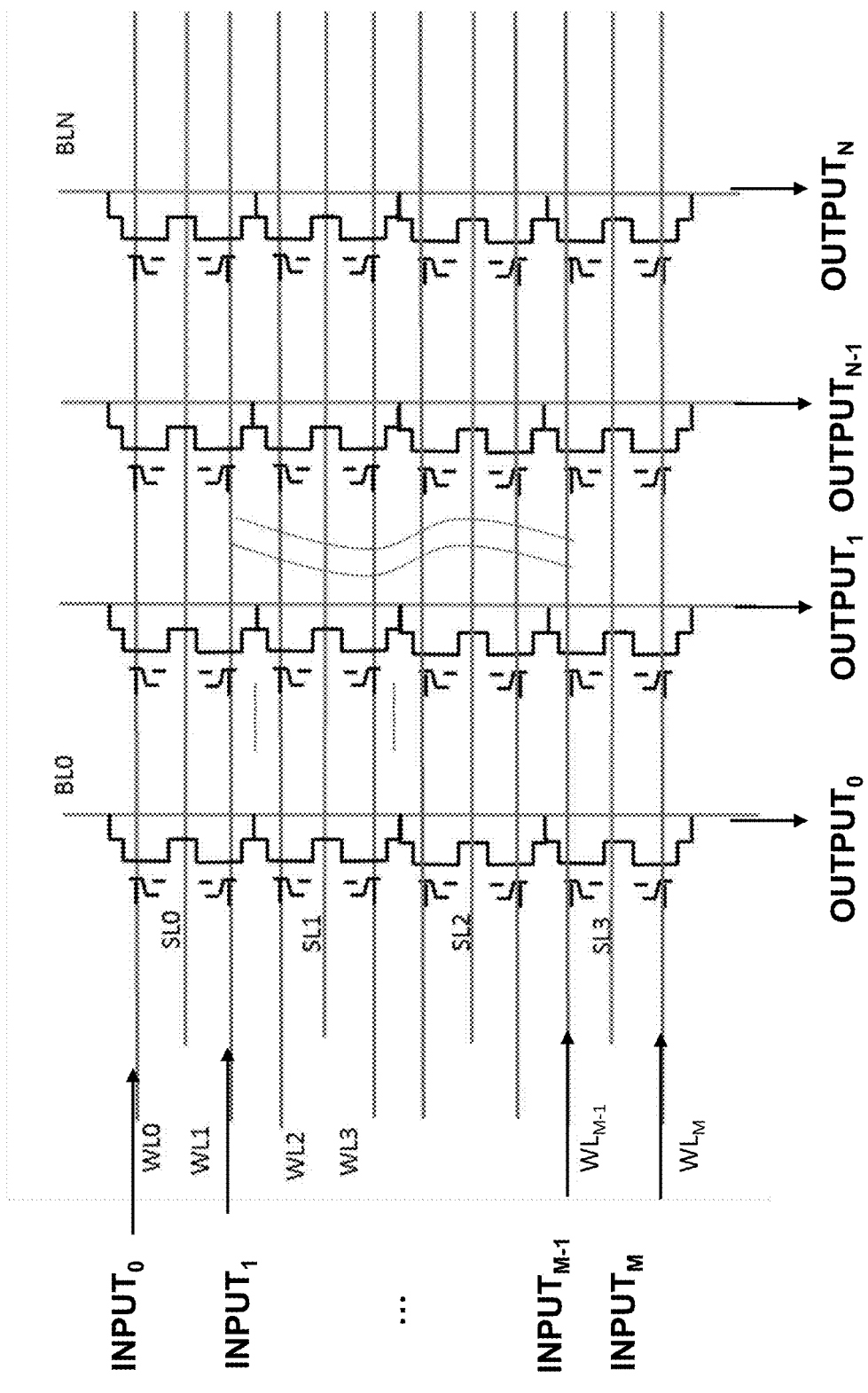
FIG. 18 depicts another embodiment of a vector-by-matrix multiplication system.

FIG. 18 depicts neuron VMM array 1800, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines BL0, BLN.

Figure 19:
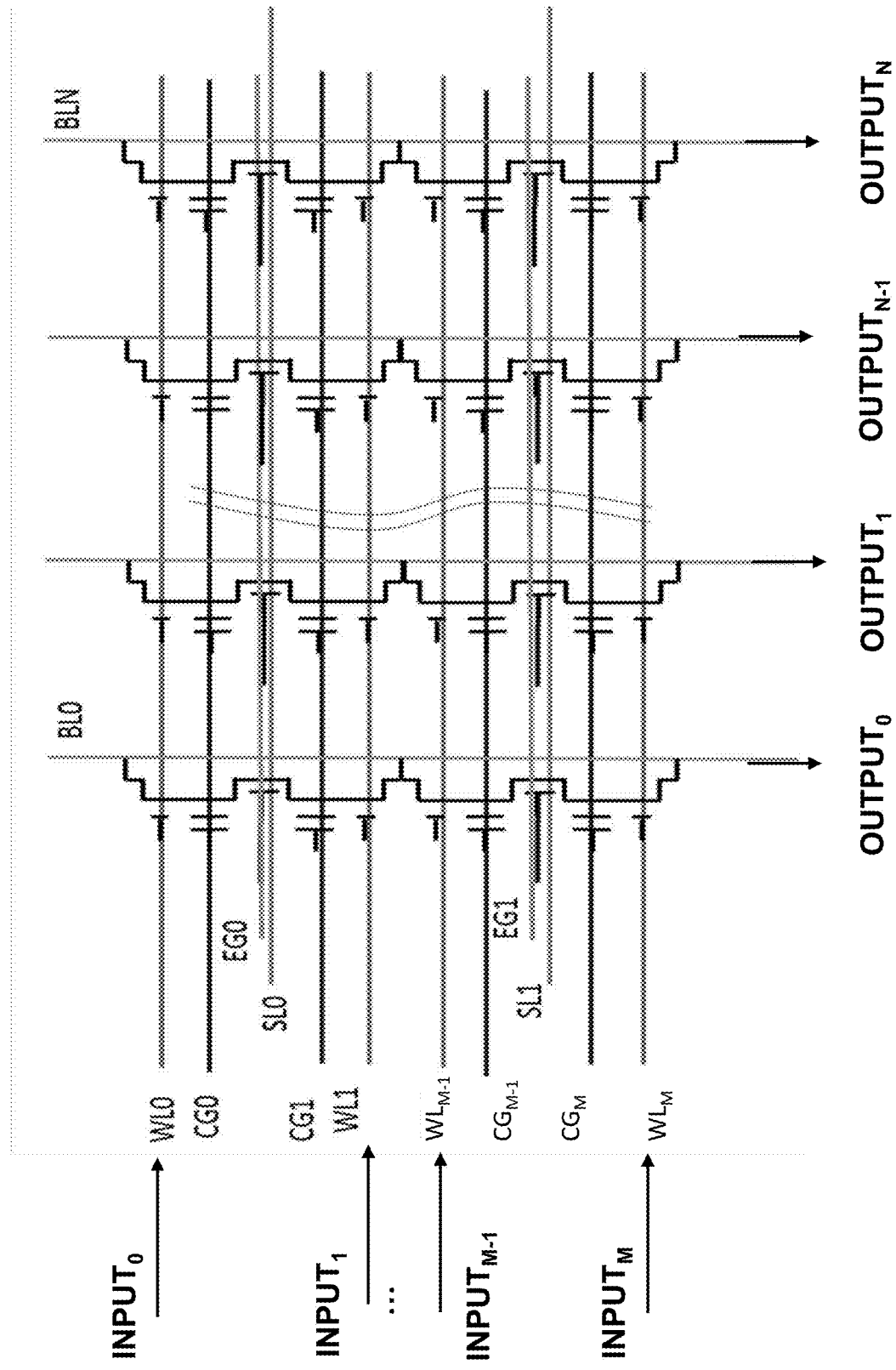
FIG. 19 depicts another embodiment of a vector-by-matrix multiplication system.

FIG. 19 depicts neuron VMM array 1900, which is particularly suited for memory cells 310 as shown in FIG. 3, and is utilized as the synapses and parts of neurons between an input layer and the next layer. In this example, the inputs $INPUT_0$, $INPUT_M$ are received on word lines $WL_0, \ldots, WL_M$, respectively, and the outputs $OUTPUT_0, \ldots OUTPUT_N$ are generated on bit lines $BL_0, \ldots,$ BLN.

Figure 20:
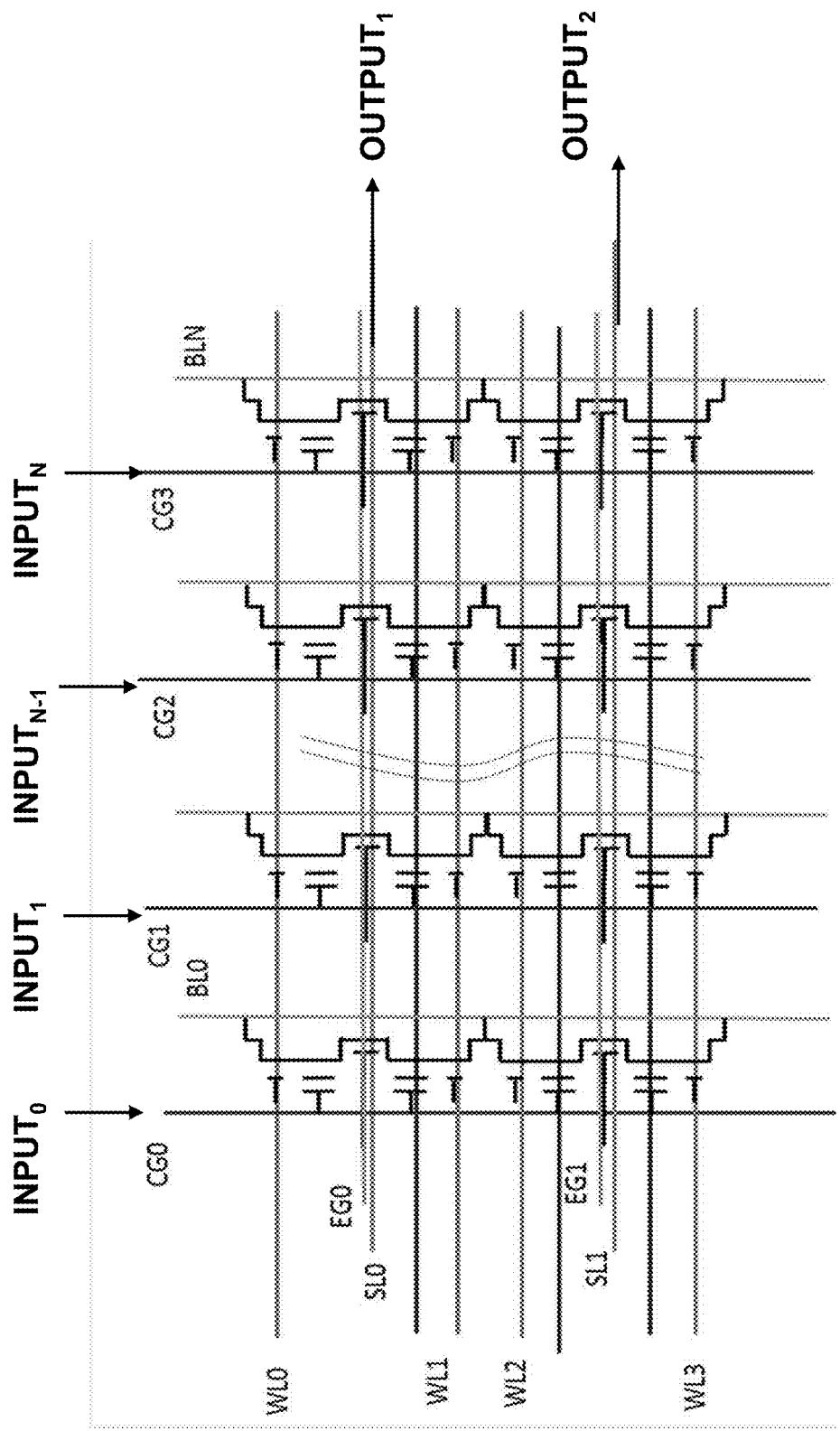
FIG. 20 depicts another embodiment of a vector-by-matrix multiplication system.

FIG. 20 depicts neuron VMM array 2000, which is particularly suited for memory cells 410 as shown in FIG. 4, and is utilized as the synapses and parts of neurons between an input layer and the next layer. In this example, the inputs $INPUT_0, \ldots, INPUT_n$ are received on vertical control gate lines $CG_0, \ldots, CG_N$, respectively, and the outputs $OUTPUT_1$ and $OUTPUT_2$ are generated on source lines $SL_0$ and $SL_1$.

Figure 21:
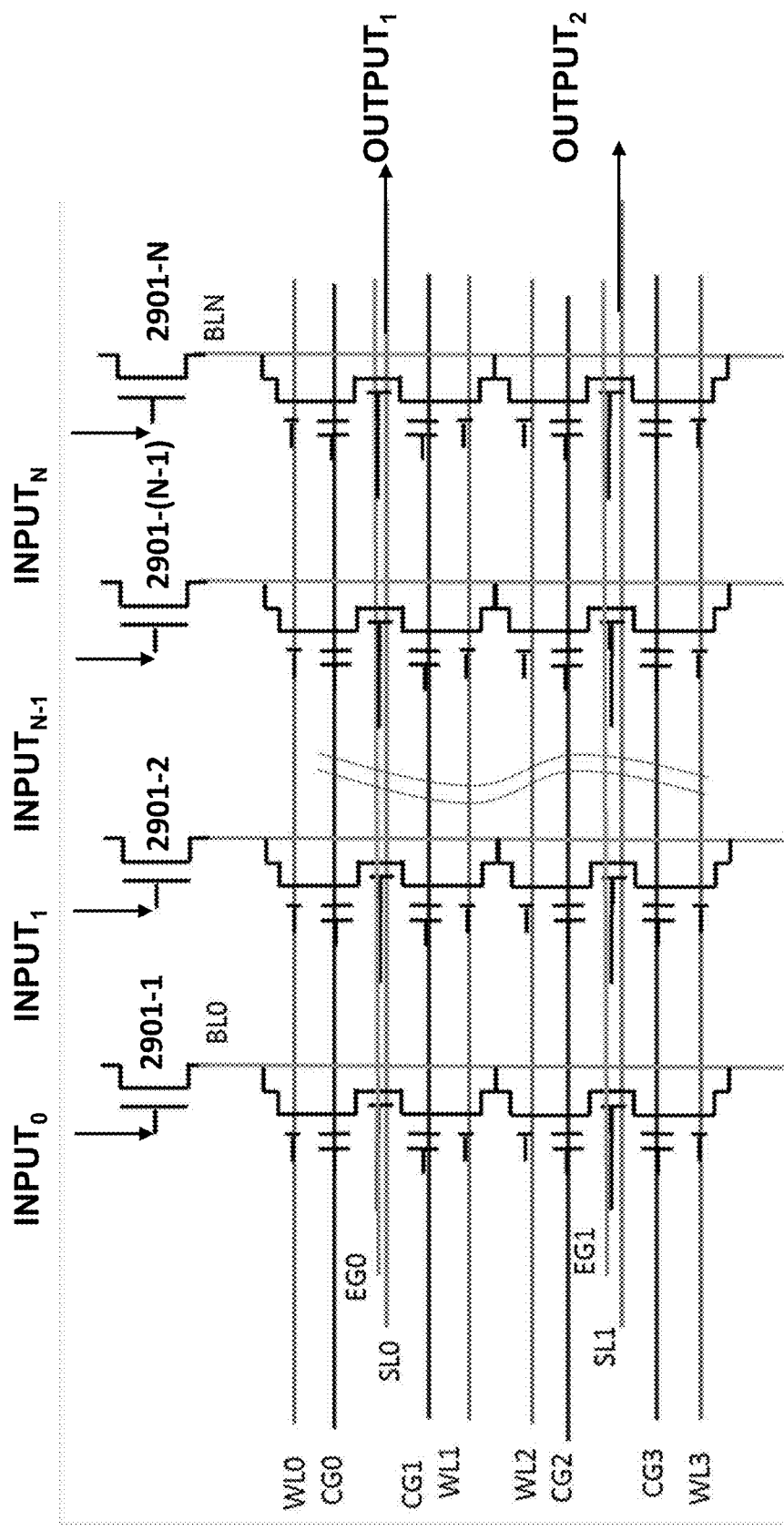
FIG. 21 depicts another embodiment of a vector-by-matrix multiplication system.

FIG. 21 depicts neuron VMM array 2100, which is particularly suited for memory cells 410 as shown in FIG. 4, and is utilized as the synapses and parts of neurons between an input layer and the next layer. In this example, the inputs $INPUT_0, \ldots, INPUT_N$ are received on the gates of bit line control gates 2901-1, 2901-2, . . . , 2901-(N−1), and 2901-N, respectively, which are coupled to bit lines $BL_0, \ldots, BL_N$, respectively. Exemplary outputs $OUTPUT_1$ and $OUTPUT_2$ are generated on source lines $SL_0$ and $SL_1$.

Figure 22:
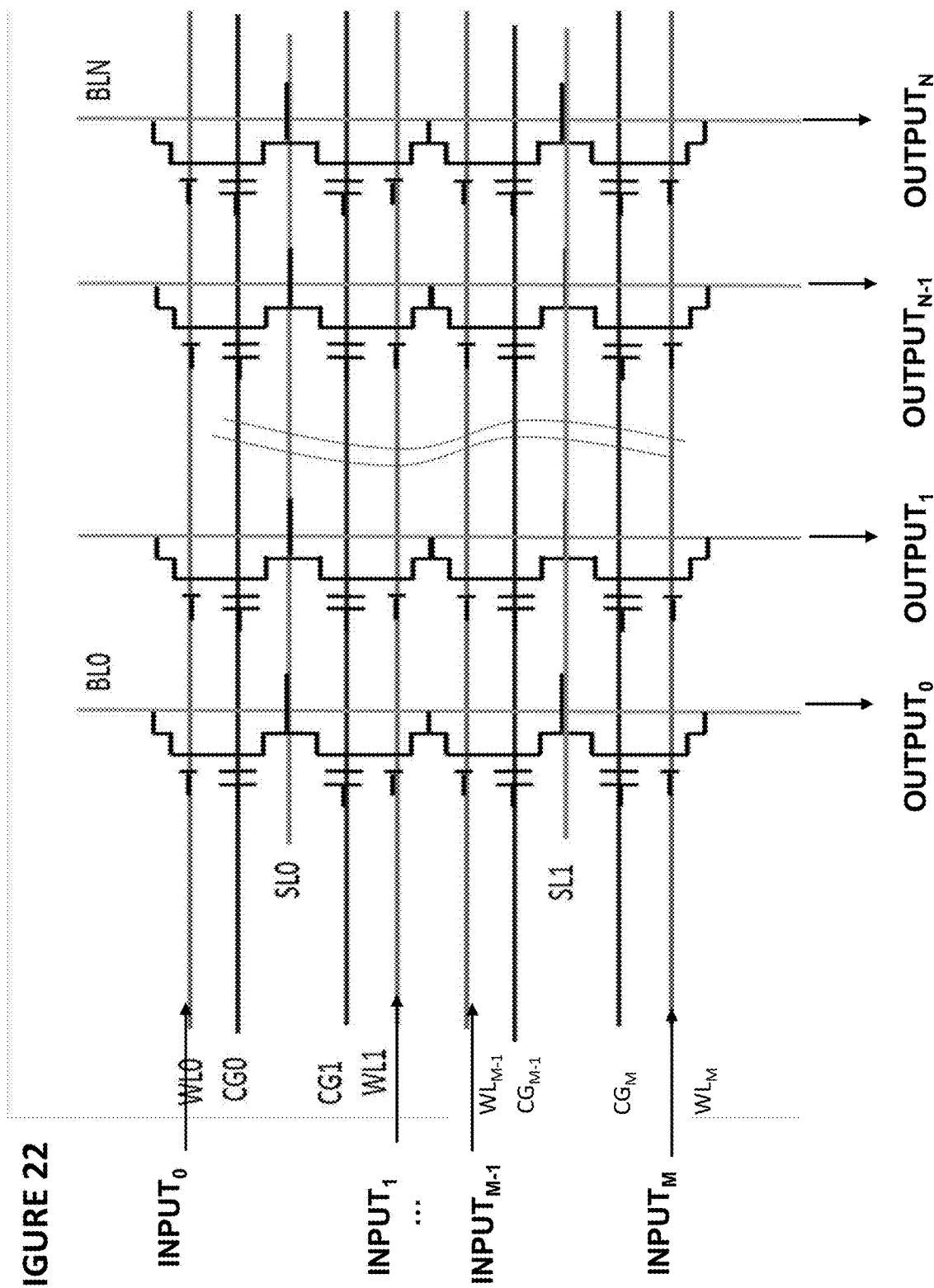
FIG. 22 depicts another embodiment of a vector-by-matrix multiplication system.

FIG. 22 depicts neuron VMM array 2200, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on word lines $WL_0, \ldots, WL_M$, and the outputs $OUTPUT_0, \ldots, OUTPUT_N$ are generated on bit lines $BL_0, \ldots, BL_N$, respectively.

Figure 23:
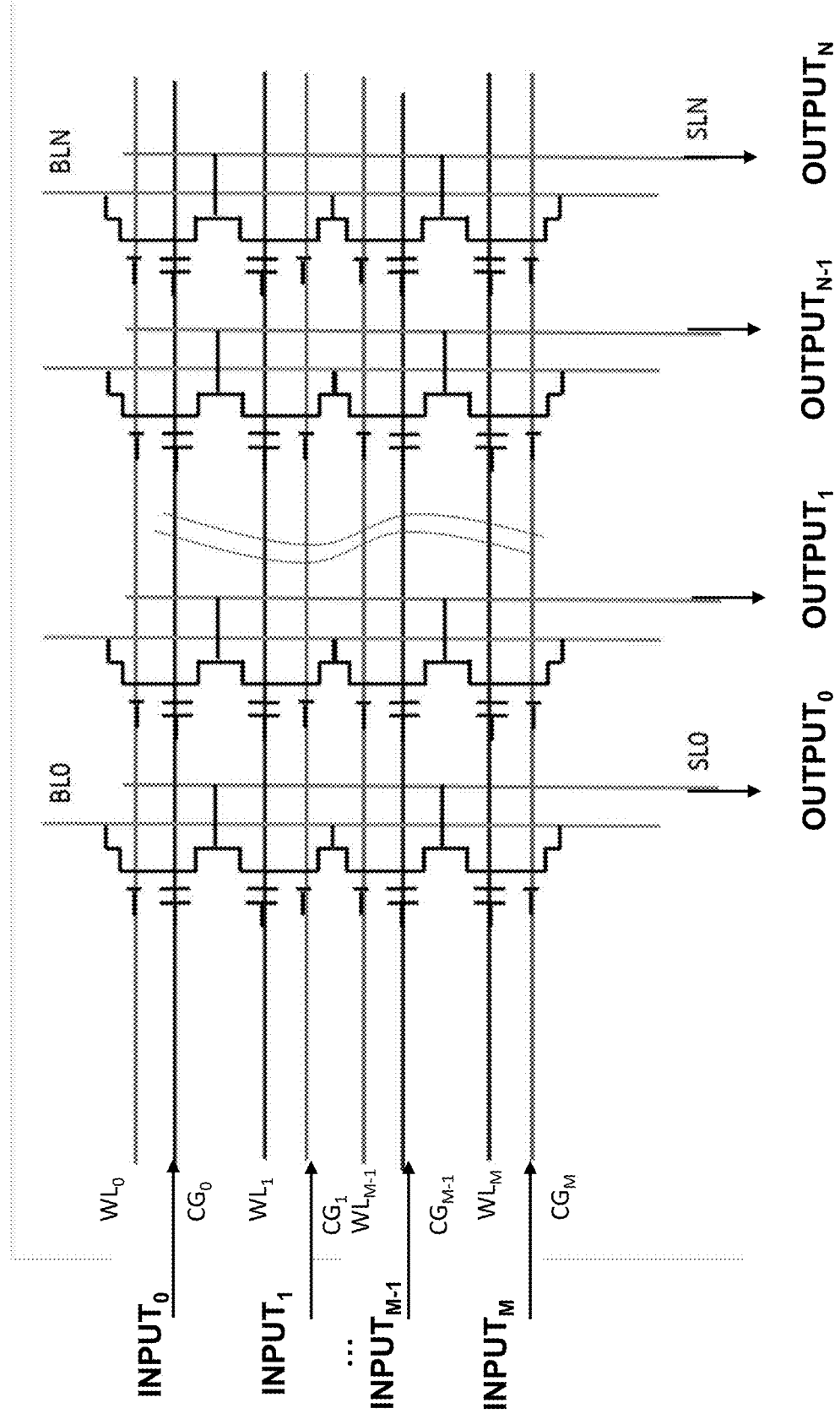
FIG. 23 depicts another embodiment of a vector-by-matrix multiplication system.

FIG. 23 depicts neuron VMM array 2300, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical source lines $SL_0, \ldots, SL_N$, respectively, where each source line $SL_i$ is coupled to the source lines of all memory cells in column i.

Figure 24:
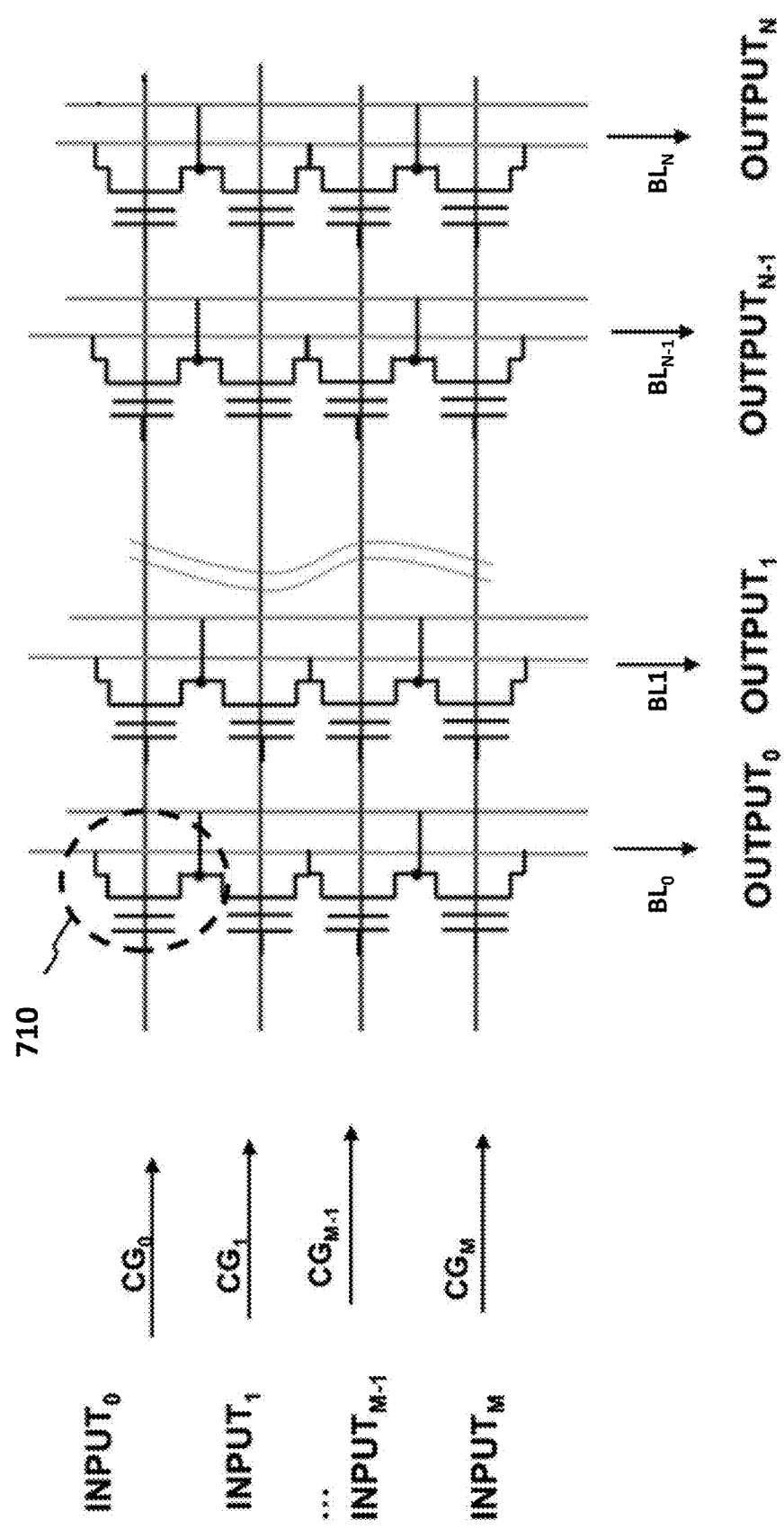
FIG. 24 depicts another embodiment of a vector-by-matrix multiplication system.

FIG. 24 depicts neuron VMM array 2400, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots CG_M$. Outputs $OUTPUT_0, \ldots, OUTPUT_N$ are generated on vertical bit lines $BL_0, \ldots BL_N$, respectively, where each bit line $BL_i$ is coupled to the bit lines of all memory cells in column i.

Testing Circuitry and Methods

Figure 25:
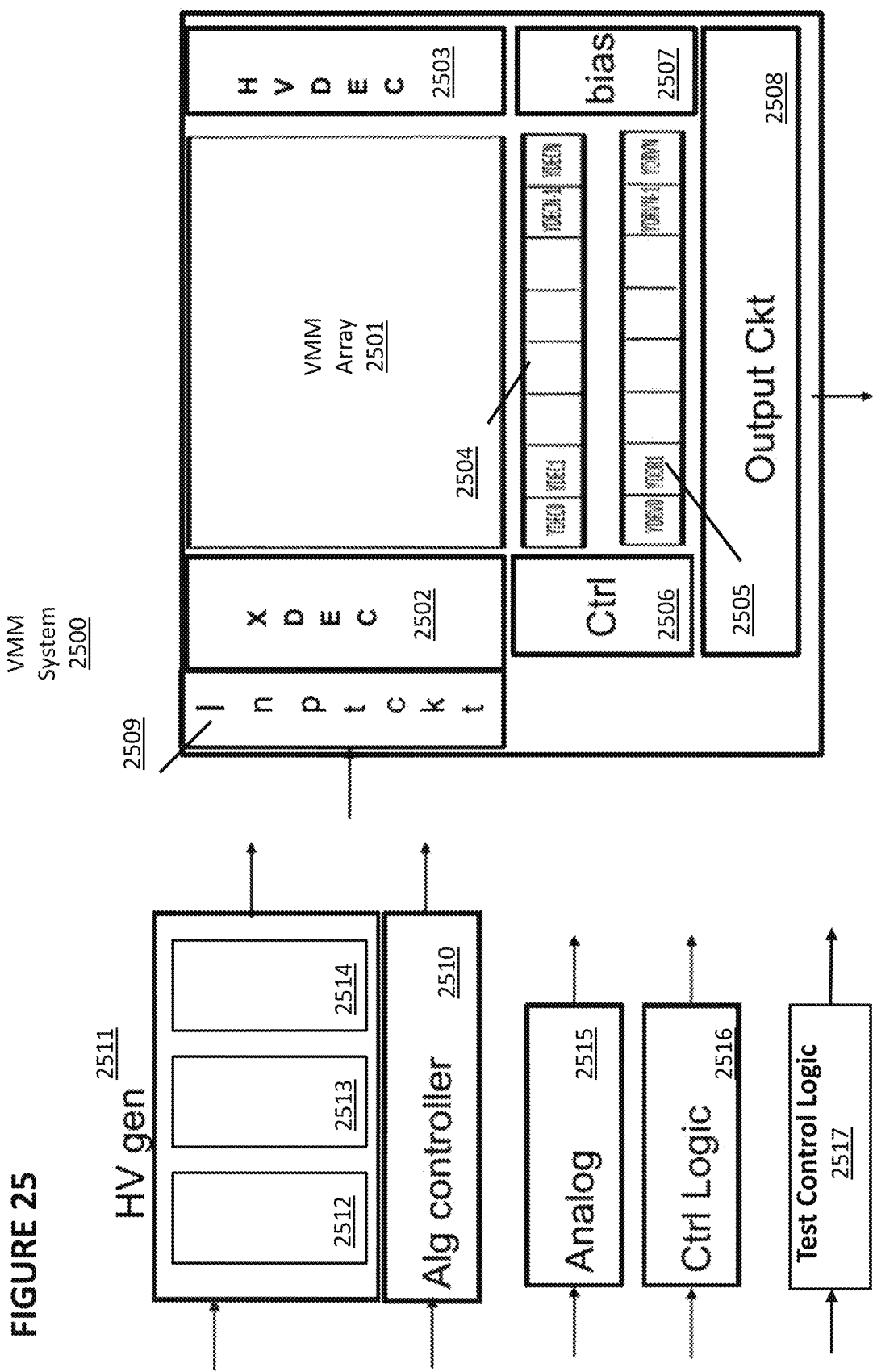
FIG. 25 depicts an embodiment of a vector-by-matrix multiplication system comprising test control logic.

FIG. 25 depicts VMM system 2500. VMM system 2500 comprises VMM array 2501 (which can be based on any of the VMM array designs discussed previously, such as VMM array 1100, 1200, 1300, 1400, 1500, 1600, 1700, 1800, 1900, 2000, 2100, 2200, 2300, and 2400 or other VMM array designs), low voltage row decoder 2502, high voltage row decoder 2503, column decoder 2504, column driver 2505, control logic 2506, bias circuit 2507, output circuit block 2508, input VMM circuit block 2509, algorithm controller 2510, high voltage generator block 2511, analog circuit block 2515, control logic 2516, and test control logic 2517.

Input circuit block 2509 serves as interface from an external input to the input terminals of the memory array 2501. Input circuit block 2509 can comprise a DAC (Digital-to-Analog Converter), DPC (Digital-to-Pulse Converter), APC (Analog-to-Pulse Converter), IVC (Current-to-Voltage Converter), AAC (Analog-to-Analog Converter such as voltage to voltage scaler), or FAC (Frequency-to-Analog Converter), without limitation. Output circuit block 2508 serves as an interface from the memory array output to an external interface (not shown). Output circuit block 2508 can comprise an ADC (Analog-to-Digital Converter), APC (Analog-to-Pulse Converter), DPC (Digital-to-Pulse Converter), IVC (Current-to-Voltage Converter), or IFC (Current-to-Frequency Converter), without limitation. Output circuit block 2508 may include activation functions, normalization circuitry, and/or re-scaling circuitry, without limitation.

Low voltage row decoder 2502 provides a bias voltage for read and program operations and provides a decoding signal for high voltage row decoder 2503. High voltage row decoder 2503 provides a high voltage bias signal for program and erase operations.

Algorithm controller 2510 provides a controlling function for bit lines during program, verify, and erase operations.

High voltage generator block 2511 comprises charge pump 2512, charge pump regulator 2513, and high voltage generation circuitry 2514 that provides the multiple voltages needed for the various program, erase, program verify, and read operations.

Test control logic 2517 contains various test control circuits for performing the testing described below with reference to FIGS. 26-31.

Figure 26:
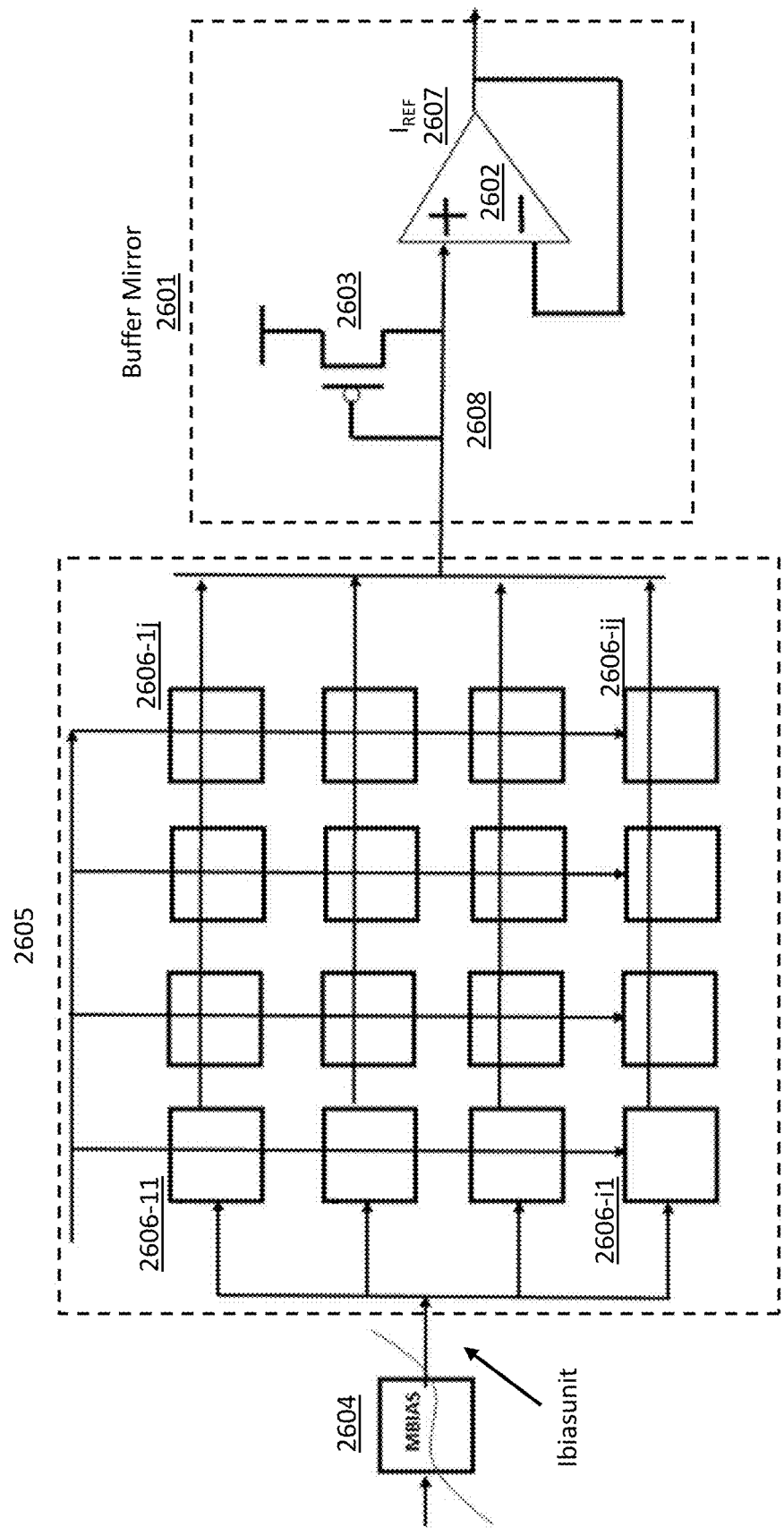
FIG. 26 depicts a reference current source.

FIG. 26 depicts reference current source 2600 for use during verify operations following a program operation of one or more non-volatile memory cells, or for use during other types of testing. For example, reference current source 2600 can be used for a verify operation of a single non-volatile memory cell, or for a verify operation for a column of non-volatile memory cells (e.g., all cells connected to a particular bit line) or some other grouping of non-volatile memory cells.

Reference current source 2600 comprises buffer mirror 2601 (which comprises buffer operation amplifier 2602 with output $I_{REF}$ 2607 and PMOS transistor 2603), adjustable bias source 2604, and two-dimensional array 2605 comprising an array of i rows and j columns of devices 2606, where a particular device 2606 is noted by the label 2606-(row) (column). Here, various combinations of devices 2606 can be activated, such that the amount of reference current $I_{REF}$ 2607 output by buffer mirror 2601 can be adjusted. As shown, there are 16 devices 2606 in the array 2605, each of which may be implemented by a current mirror. Reference current source 2600 basically converts 4 digital inputs into a reference current bias with value from 1 to 16 times Ibiasunit, where Ibiasunit is provided from the bias source 2604. Reference current source 2600 is basically a thermometer-coded Digital-to-Current Converter, whose buffered output $I_{REF}$ 2607 is of a value that corresponds to 1 of 16 levels, the particular level responsive to the 4 digital inputs, that can be stored by memory cells in any of the VMM arrays discussed previously.

For example, bias source 2604 can provide current Ibiasunit of 1 nA, which is mirrored into devices 2606. Here, the first row consists of devices 2606-11 to 2606-1j and is enabled sequentially from left to right, one device 2606 at a time. Then the next row is enabled in a sequential manner from left to right to add to the first row, meaning 5 then 6 then 7 then 8 devices 2606 are enabled. By sequentially enabling devices 2606, transistor mismatch issues associated with conventional binary decoding can be avoided. The sum of the enabled devices 2606 is then mirrored by the buffer mirror 2601 and output as current $I_{REF}$ 2607. The bias source 2604 can provide a trimmable range of current Ibiasunit such as 50 pA/100 pA/200 pA/ . . . /100 nA. Array 2605 here is shown as a 4×4 array, but it is to be understood that array 2605 could have other dimensions, such as 32×32 or 8×32.

Figure 27:
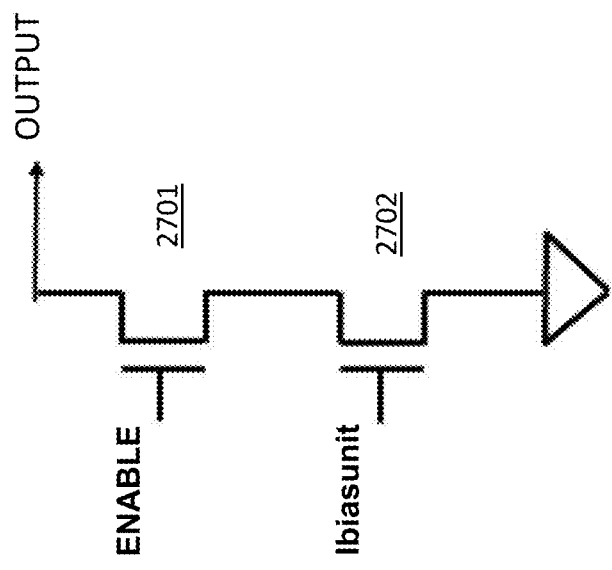
FIG. 27 depicts a reference sub-circuit for use in the reference current source of FIG. 26.

FIG. 27 depicts reference sub-circuit 2700, which can be used for any of the devices 2606 in FIG. 26. Reference sub-circuit 2700 comprises NMOS transistors 2701 and 2702, configured as shown. Transistor 2702 is a current mirror bias transistor that receives current Ibiasunit (discussed above with reference to FIG. 26) on its gate, and transistor 2701 is an enabling transistor (to enable the current mirror bias transistor 2702 to be connected to output node OUTPUT). The current Ibiasunit is provided such as from a diode connected NMOS transistor (similar to transistor 2702) (not shown).

Figure 28:
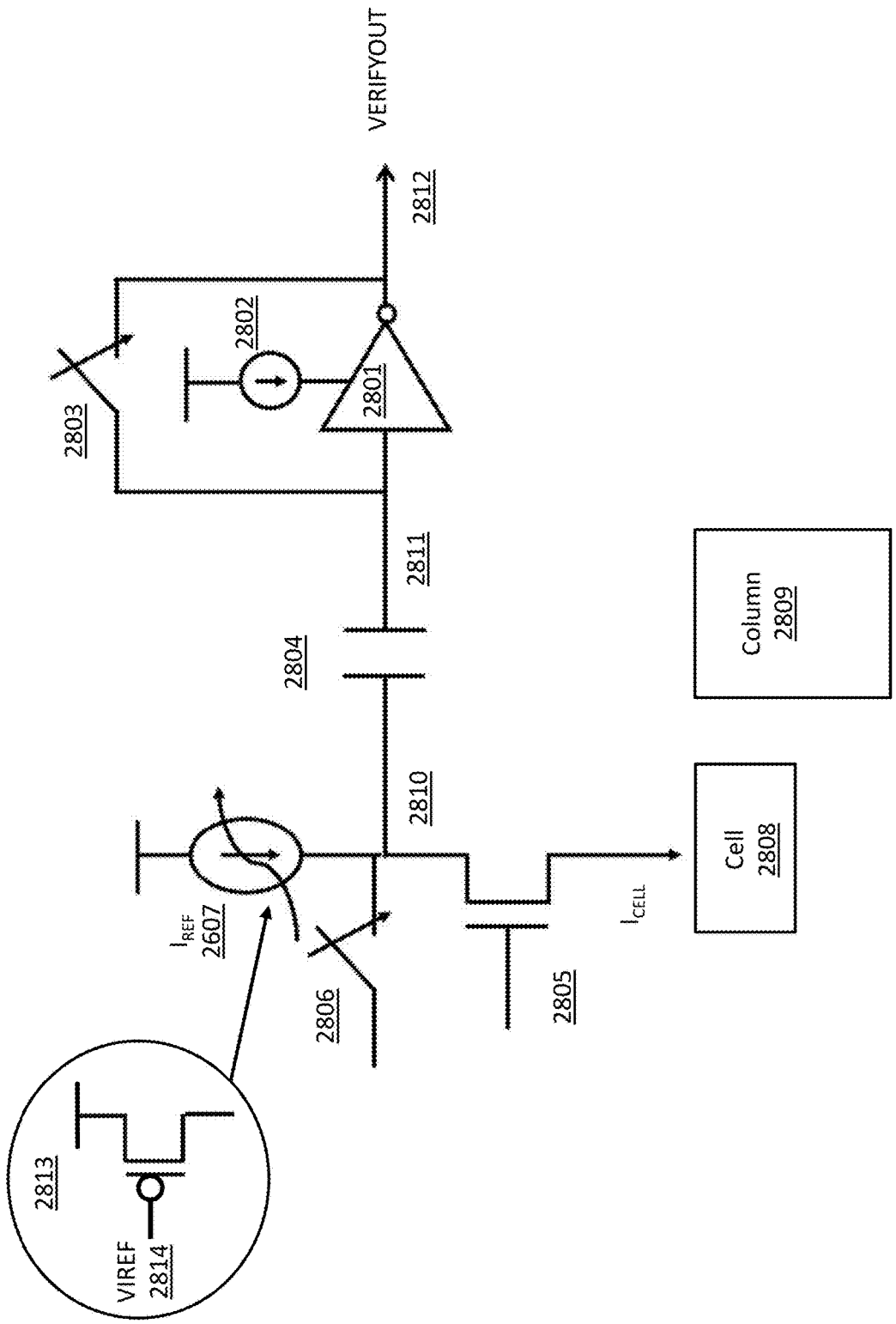
FIG. 28 depicts a sense amplifier.

FIG. 28 depicts sense amplifier 2800 to be used with reference current source 2600 during a verify operation following a programming operation of a non-volatile memory cell, a column of non-volatile memory cells, or some other grouping of non-volatile memory cells, or during another type of testing. Sense amplifier 2800 receives current $I_{REF}$ 2607 discussed above with reference to FIG. 26. $I_{REF}$ 2607 can be modeled as PMOS transistor 2813 with gate controlled by $VI_{REF}$ 2814. Sense amplifier 2800 further comprises inverter 2801, current source 2802, which is used to limit the current in inverter 2801, switches 2803 and 2806, capacitor 2804, and cascoding NMOS transistor 2805 (to impose a fixed voltage on a memory bitline). Sense amplifier 2800 receives current $I_{REF}$ 2607 from reference current source 2600, which can be, for example, one of sixteen possible levels to be stored in a non-volatile memory cell of a VMM array. Sense amplifier 2800 is coupled to cell 2808, which is the non-volatile memory cell whose contents is to be verified. Cell 2808 draws current $I_{CELL}$ when NMOS transistor 2805 is turned on. Alternatively, cell 2808 can be replaced with column 2809 (which, for convenience of the drawings, will draw a current that will still be referred to as $I_{CELL}$, which would be the neuron current drawn by column 2809).

In one embodiment, $I_{REF}$ 2607 begins at the lowest possible value (e.g., the lowest of 16 possible levels that can be stored in cell 2808 or in column 2809) and then increases sequentially to each subsequent level for verify operation. Switch 2806 can be closed to create an initial state for capacitor 2804 (such as ground or a precharge voltage to provide offset cancellation). Switch 2803 can be closed to equalize the input and output of inverter 2801, which removes the offset from the inverter 2801 for comparison in the verify operation. During the verify operation, switches 2806 and 2803 are opened. If $I_{CELL} >= I_{REF}$ 2607, then voltage on node 2810 will decrease, which in turns couples capacitively through the capacitor 2804 causing the voltage on node 2811 to decrease, resulting in the inverter output switching to '1', meaning the input of inverter 2801 will be a "0" value, and the output of inverter 2801 will be a "1" value. If $I_{CELL} < I_{REF}$ 2607, then the voltage on node 2810 will rise, which in turns couples capacitively through the capacitor 2804 causing the voltage on the node 2811 to rise, resulting in the inverter output switching to a '0', meaning the input of inverter 2801 will switch to a "1" value and the output of inverter 2801 will switch to a "0" value. The value of $I_{REF}$ 2807 at which that occurs corresponds to the value that is stored in cell 2808.

Figure 29A:
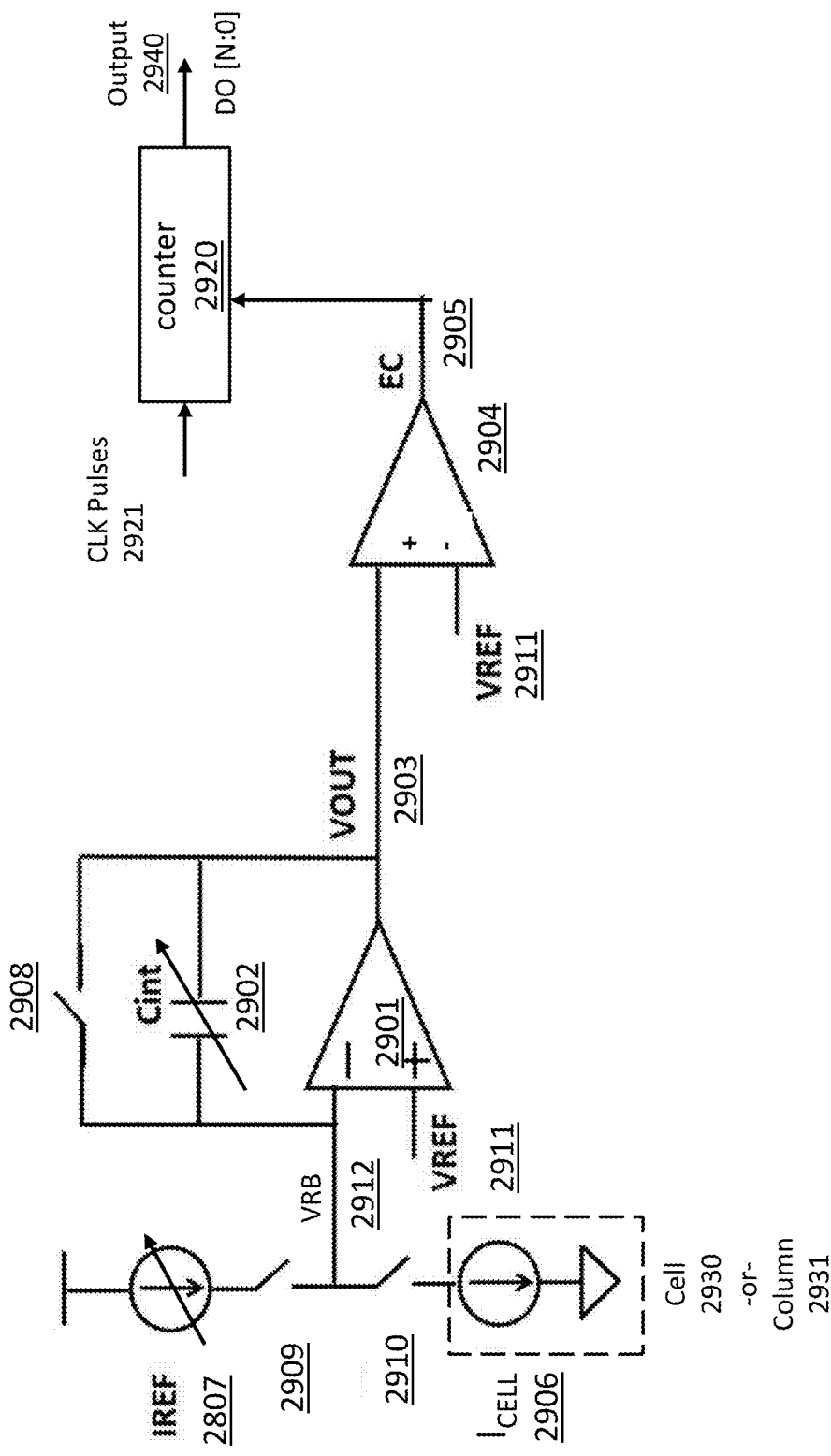
FIG. 29A depicts a verification analog-to-digital converter.

FIG. 29A depicts verification sloped analog-to-digital converter (ADC) 2900 to be used with reference current source 2600 during a verify operation of non-volatile memory cell 2930 or column 2931 following a program pulse operation, such as to verify whether the memory cell reaches a target current during a weight tuning process, or during another type of testing, such as to verify the tailed memory bits (e.g. aberrant bits) in the memory array which cannot meet the cell current requirement. $I_{CELL}$ 2906 is an output current from cell 2930 or column 2931. Verification ADC 2900 converts $I_{CELL}$ 2906 into a series of digital output bits that are output as output 2940, where output 2940 indicates the value stored in cell 2930 or column 2931.

Verification ADC 2900 comprises op-amp 2901, adjustable capacitor 2902, op-amp 2904, counter 2920, and switches 2908, 2909, and 2910. Adjustable capacitor 2902 integrates $I_{CELL}$ 2906 versus a current $I_{REF}$ provided by an adjustable current source 2807. During an initialization phase, switch 2908 is closed. Vout 2903 of op-amp 2901 and the input to the inverting input of operational amplifier 2901 then will become equal to the value of the reference voltage VREF applied to the non-inverting input of op-amp 2901. Thereafter, switch 2908 is opened and during a fixed time period tref, switch 2910 is closed and the neuron current $I_{CELL}$ 2906 is up-integrated. During the fixed time period tref, Vout 2903 rises, and its slope is reflective of the value of $I_{CELL}$ 2906. Thereafter, during a period tmeas, the constant reference current $I_{REF}$ provided by adjustable current source 2807 is down integrated, during which period Vout falls, by opening switch 2910 and closing switch 2909 where tmeas is the time required to down integrate Vout to VREF.

Output EC 2905 of op-amp 2904 will be high when VOUT 2903>VREF and will be low otherwise. EC 2905 therefore generates a pulse whose width reflects the period tmeas, which in turn is proportional to the current $I_{CELL}$ 2906.

Optionally, output EC 2905 is input to counter 2920, which counts the number of clock pulses 2921 received while output EC2905 is high, and will generate output 2940, which will be a set of digital bits representing a digital count of the number of clock pulses 2921 occurring while EC 2905 is high, which number is directly proportional to $I_{CELL}$ 2906, which corresponds to the value stored in cell 2930 or column 2931.

Figure 29B:
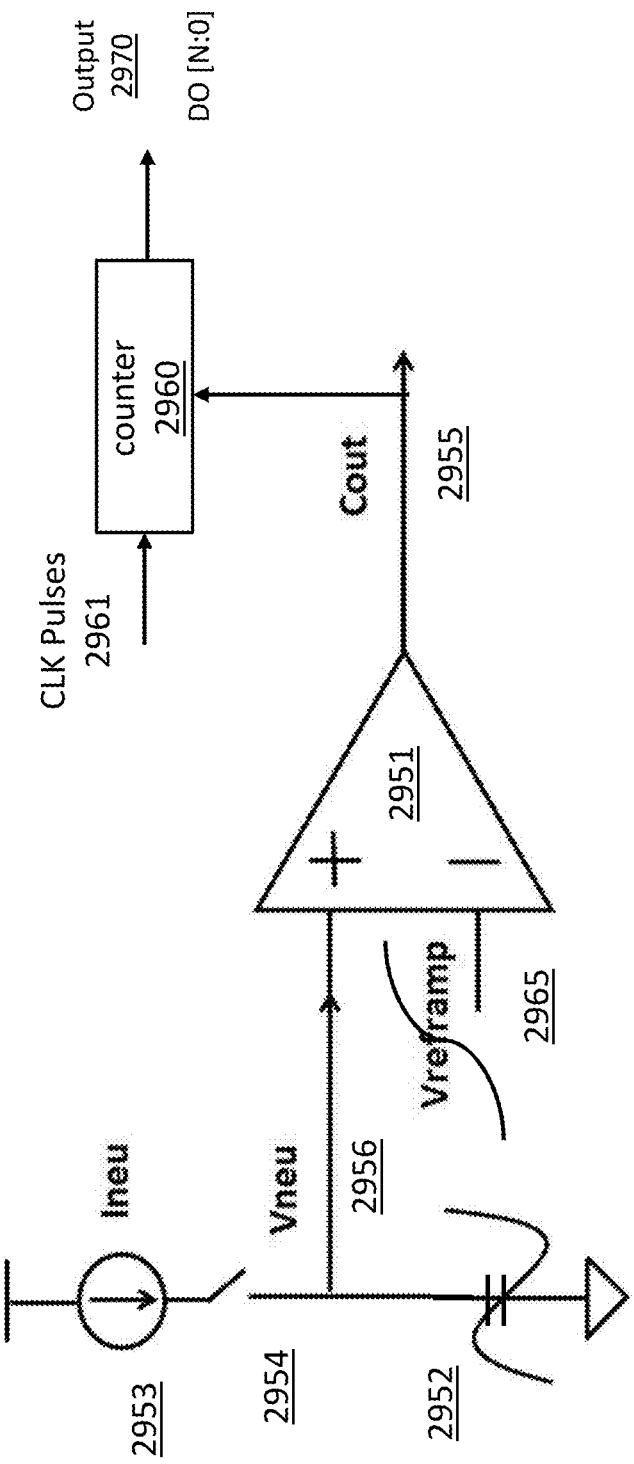
FIG. 29B depicts a verification analog-to-digital converter.

FIG. 29B depicts verification ramp analog-to-digital converter 2950, which comprises current source 2953 (which represents a received neuron current, Ineu or a single memory cell current), switch 2954, variable capacitor 2952, and comparator 2951, which receives the voltage developed across variable capacitor 2952, denoted Vneu, at the non-inverting input thereof and configurable reference voltage Vreframp at the inverting input thereof and generates output Cout. A circuit to clear the voltage across variable capacitor 2952 is not shown. Vreframp is ramped (stepped) up in discrete levels with each comparison clock cycle. Comparator 2951 compares Vneu against Vreframp, and as a result output Cout will be "1" when Vneu>Vreframp and will be "0" otherwise. Thus, output Cout will be a pulse, whose width varies in response to the value of Ineu. A larger Ineu will cause Cout to be "1" for a longer period of time, i.e. a wider pulse for output Cout. A digital counter 2960 converts the output Cout into digital output bits DO [n:0] 2970, which bits reflect the number of clock cycles 2961 for which Cout was a "1" value. Alternatively ramp voltage Vreframp is a continuous ramp voltage. A multi-ramp embodiment can be done for reducing the conversion time by utilizing a coarse-fine ramp conversion algorithm. First coarse reference ramp reference voltage is ramped in a fast manner to figure out the sub range for each Ineu. Next, fine reference ramp reference voltages are used respectively for each sub-range for converting Ineu currents within the respective sub-range. More than two coarse/fine steps or two sub-ranges are possible.

Other ADC architecture can be used as verification ADC such as flash ADC, SAR (Successive Approximation Register) ADC, Algorithmic ADC, Pipelined ADC, Sigma Delta ADC, without limitation.

Figure 30:
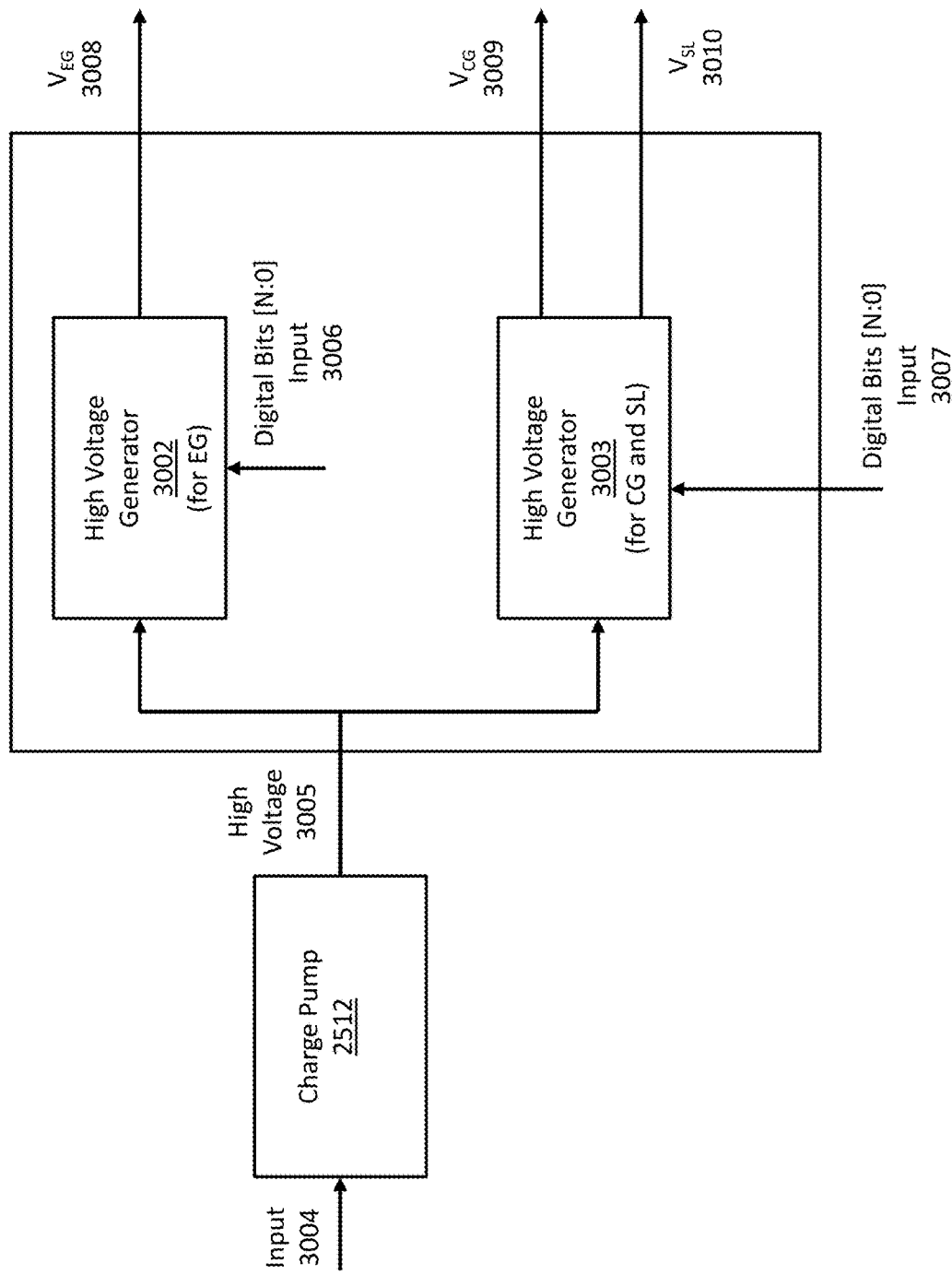
FIG. 30 depicts a high voltage generation circuit.

FIG. 30 depicts an embodiment of high voltage generation circuit 2511 described previously with reference to FIG. 25. High voltage generation circuit 2511 can be used with any of the VMM arrays discussed previously. High voltage generation circuit 2511 comprises charge pump 2512 and high voltage generation circuitry 2514. Charge pump 2512 receives input 3004 and generates high voltage 3005, which in turn is provided to high voltage generators 3002 and 3003. High voltage (HV) generator (HVDAC_EG) 3002 is a HV Digital-to-Analog Converter that provides voltages, denoted $V_{EG}$ 3008, such as incremental voltages, suitable for application to the erase gate terminal of a split-gate flash memory cell in response to digital bits 3006 and received high voltage 3005. High voltage generator (HVDAC CGSL) 3003 is a HV Digital-to-Analog Converter that provides voltages, respectively denoted $V_{CG}$ 3009 and $V_{SL}$ 3010, such as incremental voltages, suitable for application to the control gate terminal and source line terminal of a split-gate flash memory cell in response to digital bits 3007 and received high voltage 3005.

Figure 31:
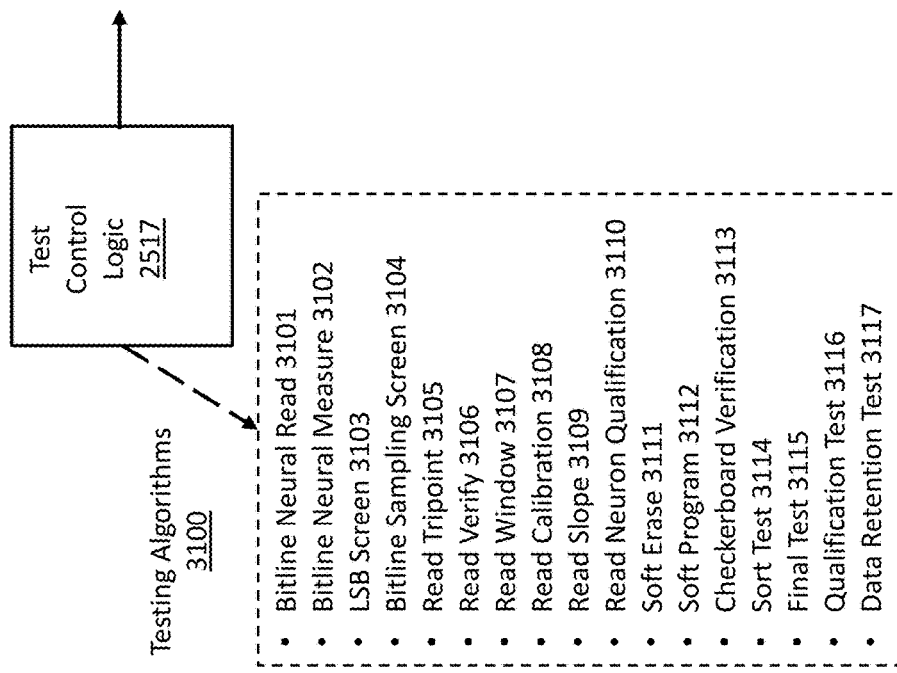
FIG. 31 depicts exemplary testing algorithms implemented by test control logic in a vector-by-matrix multiplication system.

FIG. 31 depicts VMM system 2500 described previously with reference to FIG. 25, but here shown in a testing configuration. Test control logic 2517 provides control signals to the other components of VMM system 2500 (shown in FIG. 25 but not in FIG. 31), such as VMM array 2501, row decoder 2502, column decoder 2504, input block 2509, high voltage decoder 2503, column driver 2505, high voltage generation block 2511, analog block 2515, algorithm controller 2510, and output circuit block 2508 to implement one or more testing algorithms 3100. VMM array 2501 receives control signals from row decoder 2502, whereby one or more rows are asserted within VMM array 2501. VMM array 2501 provides signals from one or more bit lines to column decoder 2504, which then provides outputs from one or more bit lines to output circuit block 2508. Output circuit block 2508 can comprise an analog-to-digital converter block (such as verification ADC 2900 described previously with reference to FIG. 29A or verification ramp ADC 2950 described previously with reference to FIG. 29B) that provides a digital output representing the analog current received by output circuit block 2508 from VMM array 2501.

Table No. 9 contains exemplary values to be applied to word lines, control gate lines, erase gate lines, source gate lines, and bitlines within VMM array 2501 during program, erase, read, and verify operations performed on an individual memory cell; verify neuron and read neuron operations performed on a selected bit line coupled to a column of memory cells; and a read array operation whereby every bit line is read, where each bit line is coupled to a column of memory cells.

TABLE NO. 9

Exemplary Values for Operations Within VMM Array 2501

|  | WL sel | WL unsel | CG sel | CG unsel | EG sel | EG unsel | SL sel | SL unsel | BL sel | BL unsel |
|---|---|---|---|---|---|---|---|---|---|---|
| Program | 0.9 V | 0 v | up to 10.5 V | 0 v | up to 4.5 V | 0 v | up to 4.5 V | ~0.5 v | Iprog | Vinh |
| Erase | 0 v | 0 v | 0 v | 0 v | 6 V-11.5 V | 0 v | 0 v | 0 v | 0 v | 0 v |
| Read | 1.1 V | 0 v | 2.5 V | 2.5 V | 2.5 V | 2.5 V | 0 v | 0 v | 0.6 V | 0 v |
| Verify | 1.1 V | 0 v | 0 V-1.5 V | 0 v | 0 V | 0 v | 0 v | 0 v | 0.6 V | 0 v |
| Neuron Read | 1.1 V | 1.1 V | 0 V-1.5 V | 0 V-1.5 V | 0 V | 0 V | 0 v | 0 V | 0.6 V | 0.6 V |
| Neuron Read Array | 1.1 V | 1.1 V | 0 V-1.5 V | 0 V-1.5 V | 0 V | 0 V | 0 v | 0 V | 0.6 V | 0 v |

Further detail will now be provided on the types of tests that can be performed with reference to testing algorithms 3100 depicted in FIG. 31 and described in further detail in FIGS. 32-44, which are implemented by test control logic 2517 and other components of VMM system 2500.

Figure 32:
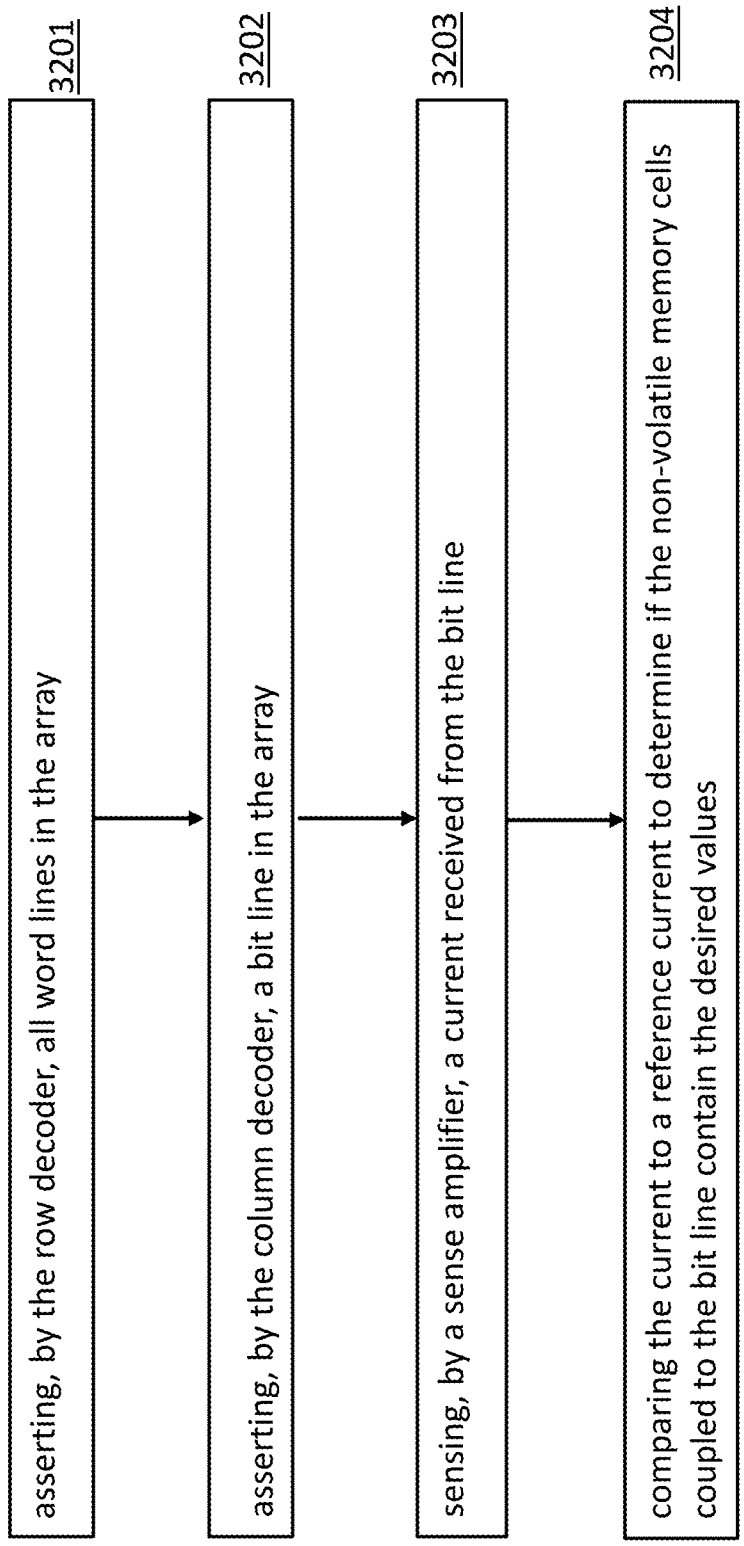
FIG. 32 depicts an embodiment of a bitline neural read test

With reference to FIG. 32, bitline neural read test 3101 measures the values in all memory cells coupled to a bitline at the same time. That is, bitline neural read test 3101 reads a neuron in a VMM array. First, row decoder 2502 asserts all word lines in the array (step 3201). Second, a bit line is selected (asserted) by column decoder 2504 (step 3202). Third, a read is performed on that bit line, such as by sense amplifier 2800 sensing a current received from the bit line (step 3203). Fourth, the value of selected bit line can be determined by comparison to reference currents generated by reference current source 2600 to determine if the non-volatile memory cells, i.e. neuron, coupled to the selected bit line contains the desired value(s) (step 3204).

Figure 33:
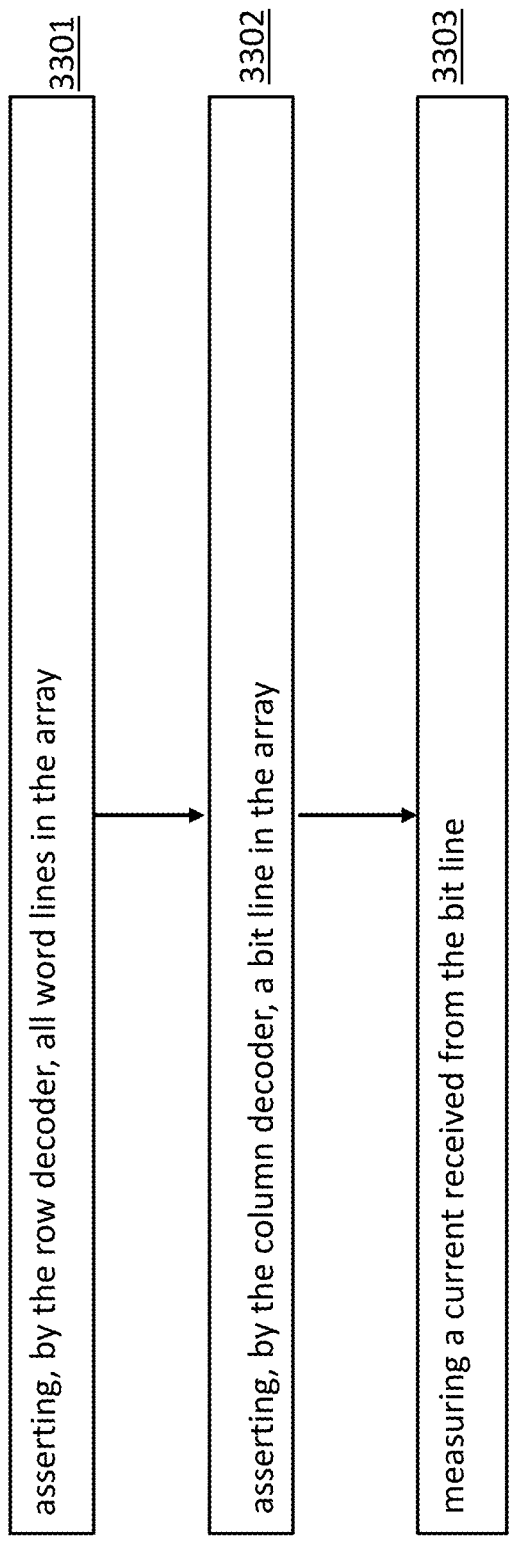
FIG. 33 depicts an embodiment of a bitline neural measure test.

With reference to FIG. 33, bitline neural measurement test 3102 is similar to a bitline neural read test 3101. Row decoder 2502 asserts all word lines (step 3301). A bit line is selected by column decoder 2504 (step 3302). The current drawn by that bit line during a read operation is measured (step 3303). Here, unlike in bitline neural read test 3101, the current from a selected bitline is measured without comparison to reference currents.

Figure 34:
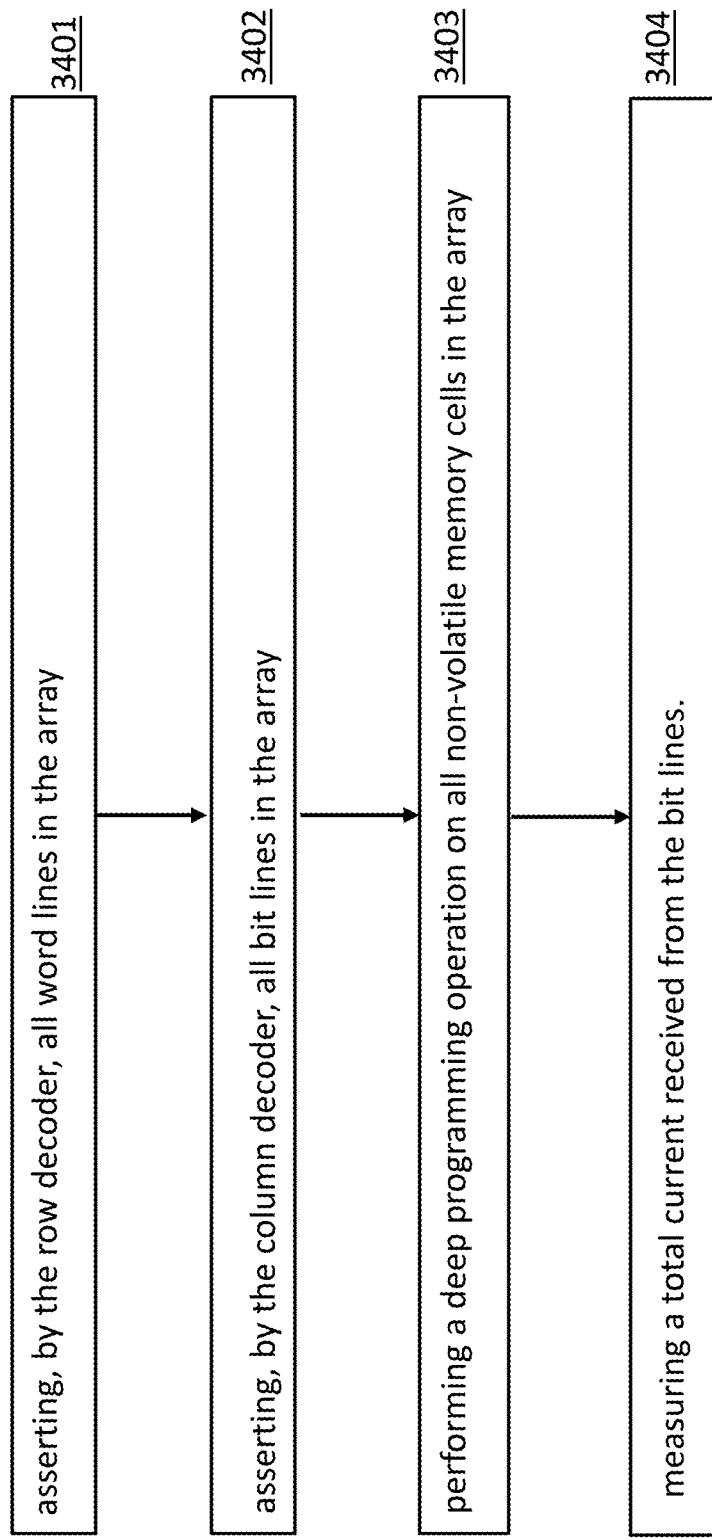
FIG. 34 depicts an embodiment of an LSB screen test.

With reference to FIG. 34, during LSB screen test 3103, row decoder 2502 asserts all word lines (step 3401), and column decoder 2504 asserts all bit lines (step 3402). A deep programming is performed on all memory cells in VMM array 2501 (step 3403). Deep programming will program all memory cells beyond the normal program states used for inference reading. It is done with longer program timing or higher program voltages than are normally used in operation. The total current received from all bit lines is then measured (step 3404). The expectation is that the total current of the deep programmed array will be much less than the LSB value. In addition, each individual cell is checked to make sure the current from the individual cell is also lower than an LSB value, such as 50-100 pA. This type of test is suitable for testing during the manufacturing process to quickly identify bad die.

Figure 35:
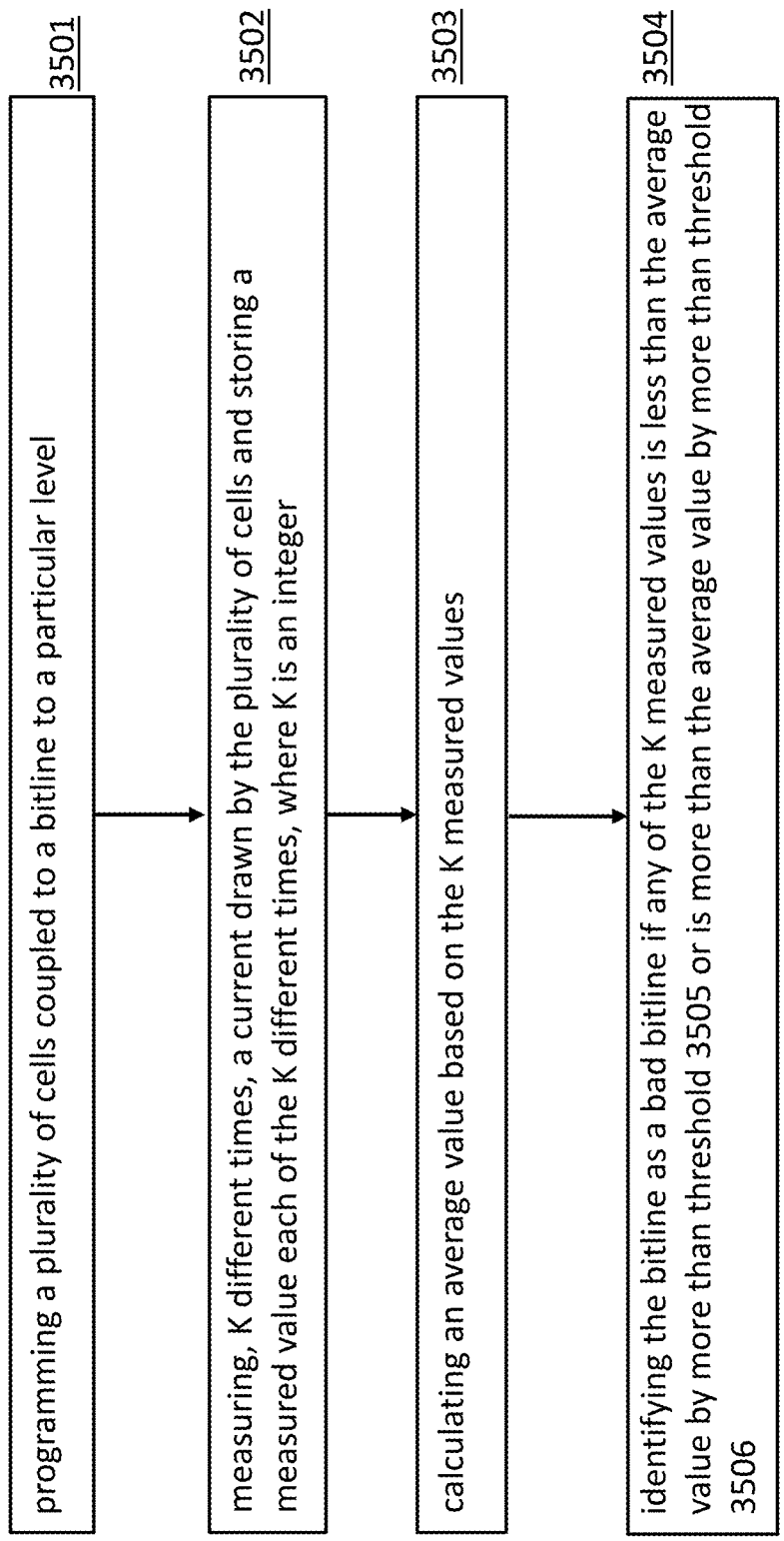
FIG. 35 depicts an embodiment of a bitline sampling screen test.

With reference to FIG. 35, during bitline sampling screen test 3104, a memory cell or set of memory cells are programmed to a particular level, for example, Lx, where x ranges from 1 to N, where N is the total number of levels that can be stored in a cell (e.g., N=16) (step 3501). Bitline current (meaning the current drawn by a cell or set of cells in the selected bitline, referred to as $I_{BL}$) is then measured K times (step 3502). For example, if K=8, then the bit line current is measured 8 times. The average value ($I_{AVG}$) is then calculated based on the K measured values of step 3502 (i.e., $I_{BL1} \ldots I_{BLK}$) (step 3503).

Next, each of the K current measurements, $I_{BL1} \ldots I_{BLK}$, is checked against $I_{AVG}$ (step 3504). If Tim, (where i ranges from i to K)>($I_{AVG}$+threshold 3505) or Tim, <($I_{AVG}$—threshold 3506), then the bitline is considered bad. Each cell in a bad bitline is then checked, and bad cells are replaced with redundant cells (such cells from a redundant row or redundant column).

Figure 36:
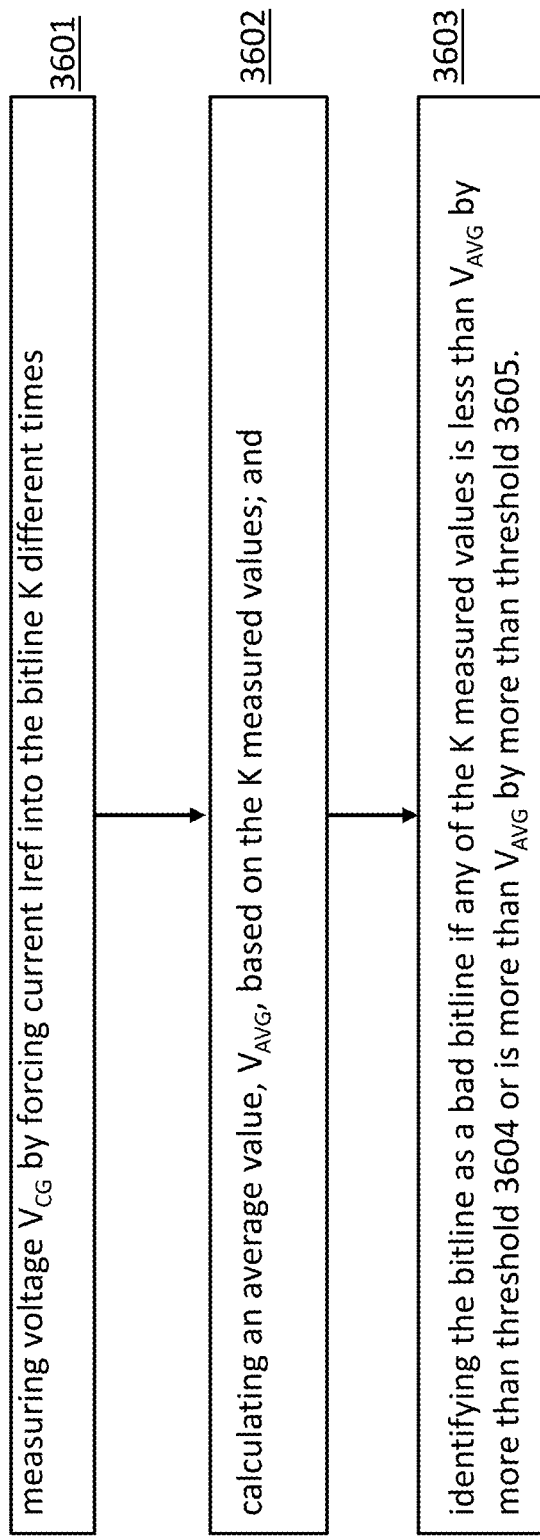
FIG. 36 depicts another embodiment of a bitline sampling screen test.

Another embodiment of bitline sampling screen test 3104 is depicted in FIG. 36. Voltage $V_{CG}$ is measured by forcing the current Iref into the bitline K different times (step 3601). For example, the voltage $V_{CG}$ can be swept until the bitline current matches the fixed Iref, and that particular $V_{CG}$ can be measured and stored. The fixed Iref can be provided by the reference current source 2600, and the operation of verifying whether bitline current matches the fixed Iref can be performed by sense amplifier 2800. Then, the average value, $V_{AVG}$, is calculated from the K different $V_{CG}$ values. Next, each of the K measured $V_{CG}$ voltages is checked against $V_{AVG}$ (step 3603). If $V_{CGi}$ (where i ranges from i to K)> ($V_{AVG}$+threshold 3604) or $V_{CGi}$<($V_{AVG}$-threshold 3605), then the bitline is considered bad. Each cell in the bad bit line is then checked, and bad cells are replaced with redundant cells (redundant row or redundant column).

During read tripoint test 3105, coarse and fine read reference current trimming are performed using different levels of Iref in read operation. The purpose of read trip point test 3105 is to figure out the whether a selected memory cell can pass a predetermined current percentage target such as ~40% of fully erased cell for erased cells or ~5% of fully programmed cell for programmed cells. This is such as to ensure the memory cell is within main distribution, not tailed memory cells or tailed bits (i.e., a statistical outlier), as tailed memory cells or tailed bits can cause potential reliability issues over an operating lifetime.

Figure 37:
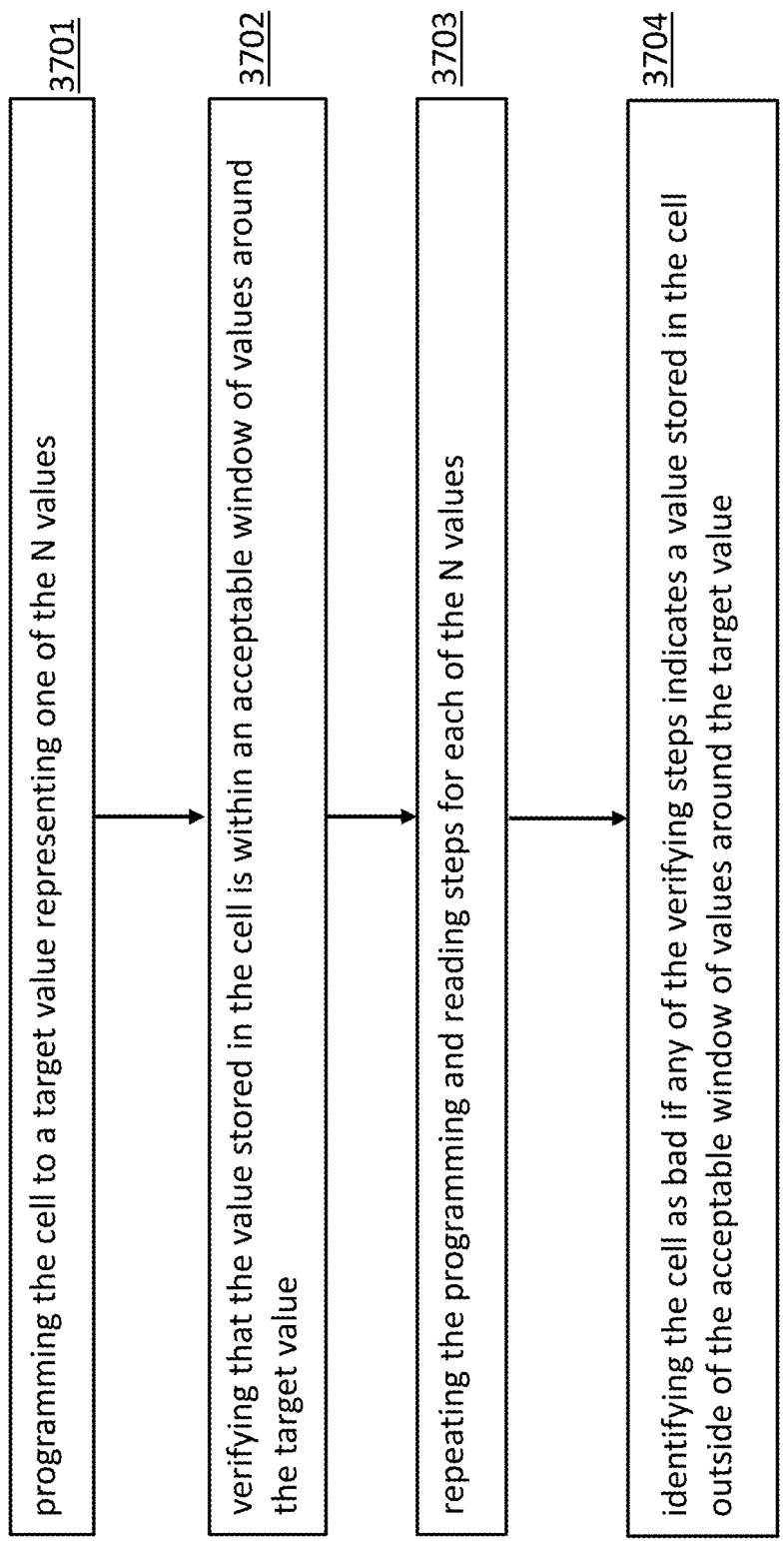
FIG. 37 depicts an embodiment of a read window check test.

With reference to FIG. 37, during read window check test 3107, a cell is tested to ensure it is able to store each of the N possible levels. First, a cell is programmed to a target value representing one of the N values (step 3701). Next, a verifying operation is performed to determine if the value stored in the cell is within an acceptable window 3710 of values around the target value (step 3702). Steps 3701 and 3702 are repeated for each of the N values (step 3703). The acceptable window 3710 may be different for each N value. The cell is identified as bad if any of the instances of step 3702 being performed indicate a value stored in the cell outside of the acceptable window of values around the target value. Read window check test 3107 can be performed by sense amplifier 2800, ADC 2900, ADC 2950, or another component. This can be useful for performing weight tuning for memory cells. The above has been explained in an embodiment wherein a fixed window is used for each of the N values centered on a nominal value, it being understood that in another embodiment an upper threshold and lower threshold is utilized for each of the N values, and these thresholds need not be identical among all the N values, without exceeding the scope.

Figure 38:
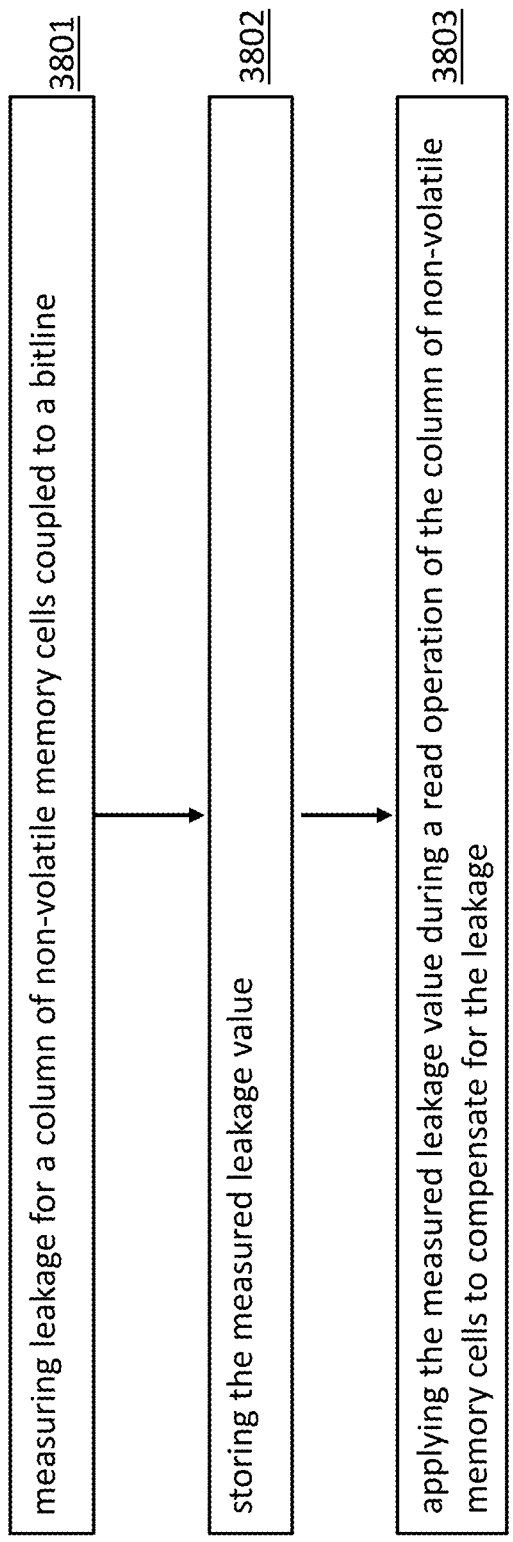
FIG. 38 depicts an embodiment of a read calibration test.

With reference to FIG. 38, during read calibration test 3108, leakage is measured for a cell or group of cells such as cells coupled to a bit line (step 3801), the measured leakage ($I_{LEAKAGE}$) is stored (step 3802), and the measured leakage value is later used during a read operation to compensate for the leakage over various combinations of process/voltage/temperature (PVT) (step 3803). In one embodiment, a plurality of cells are each programmed with known values. The word lines and control gate lines are set to ground, and the bit lines are set to a read bias voltage. A sequence of different reference currents are injected into the array, and the resulting data read out is read by sense amplifiers such as ADC circuits 2900 or 2950 or sense amplifier 2800. The injected current that yields the best results (compared to the known values that were programmed into the cells) is stored as $I_{LEAKAGE}$. Thereafter, $I_{LEAKAGE}$ is applied during a read operation of the same cells, such as by subtracting the stored leakage level from conversion data during a read operation to compensate for leakage occurring within the selected cells.

Figure 39:
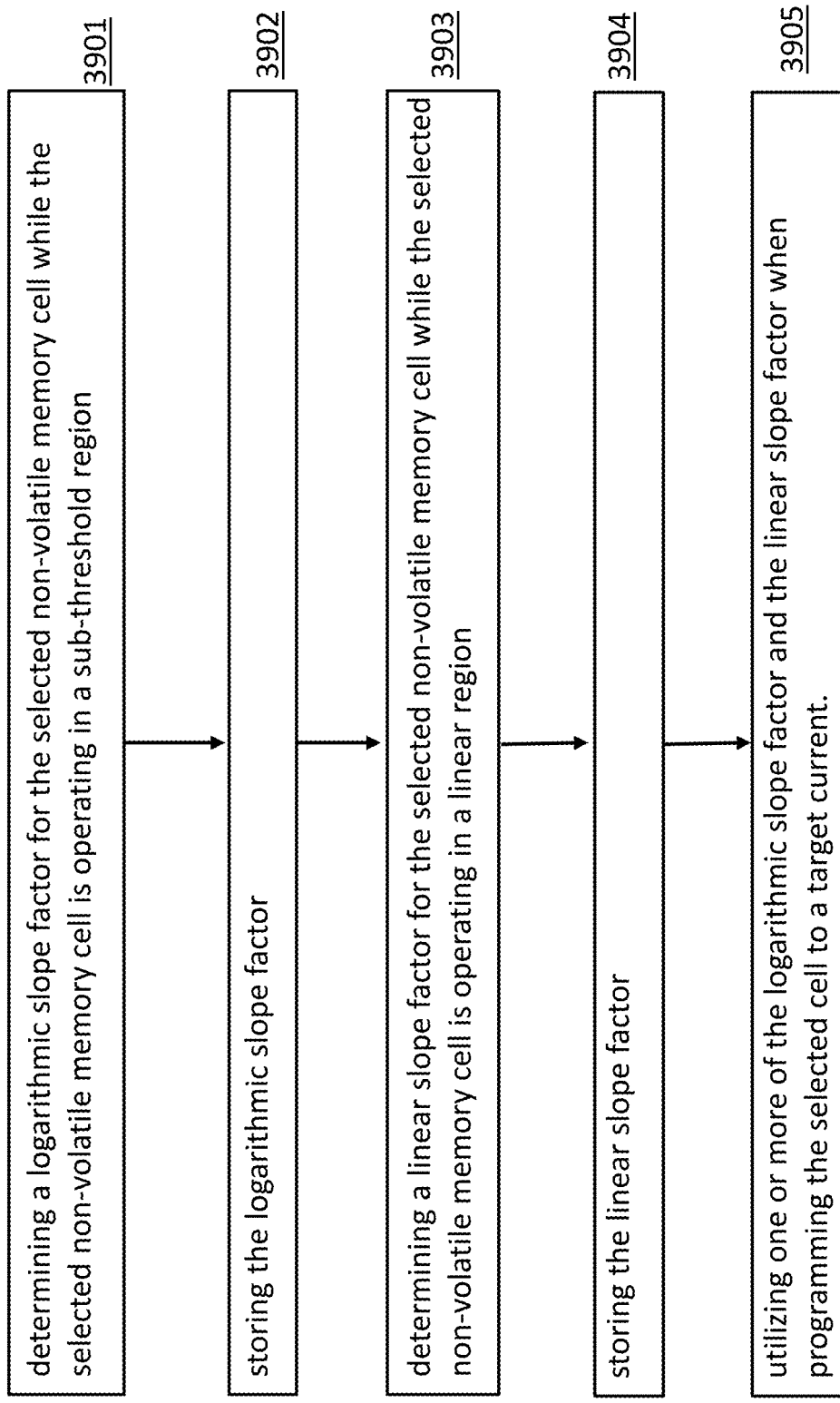
FIG. 39 depicts an embodiment of a read slope test.

With reference to FIG. 39, during read slope test 3109, the I-V slope factor is determined for the control gate voltage against two reference currents, CG1 at current IR1 and CG2 at current IR2. The first step is determining a logarithmic slope factor for the selected non-volatile memory cell while the selected non-volatile memory cell is operating in a sub-threshold region (step 3901). The second step is storing the logarithmic slope factor (step 3902). The third step is determining a linear slope factor for the selected non-volatile memory cell while the selected non-volatile memory cell is operating in a linear region (step 3903). The fourth step is storing the linear slope factor (step 3904). The fifth step is utilizing one or more of the logarithmic slope factor and the linear slope factor when programming the selected cell to a target current (step 3905).

Figure 40:
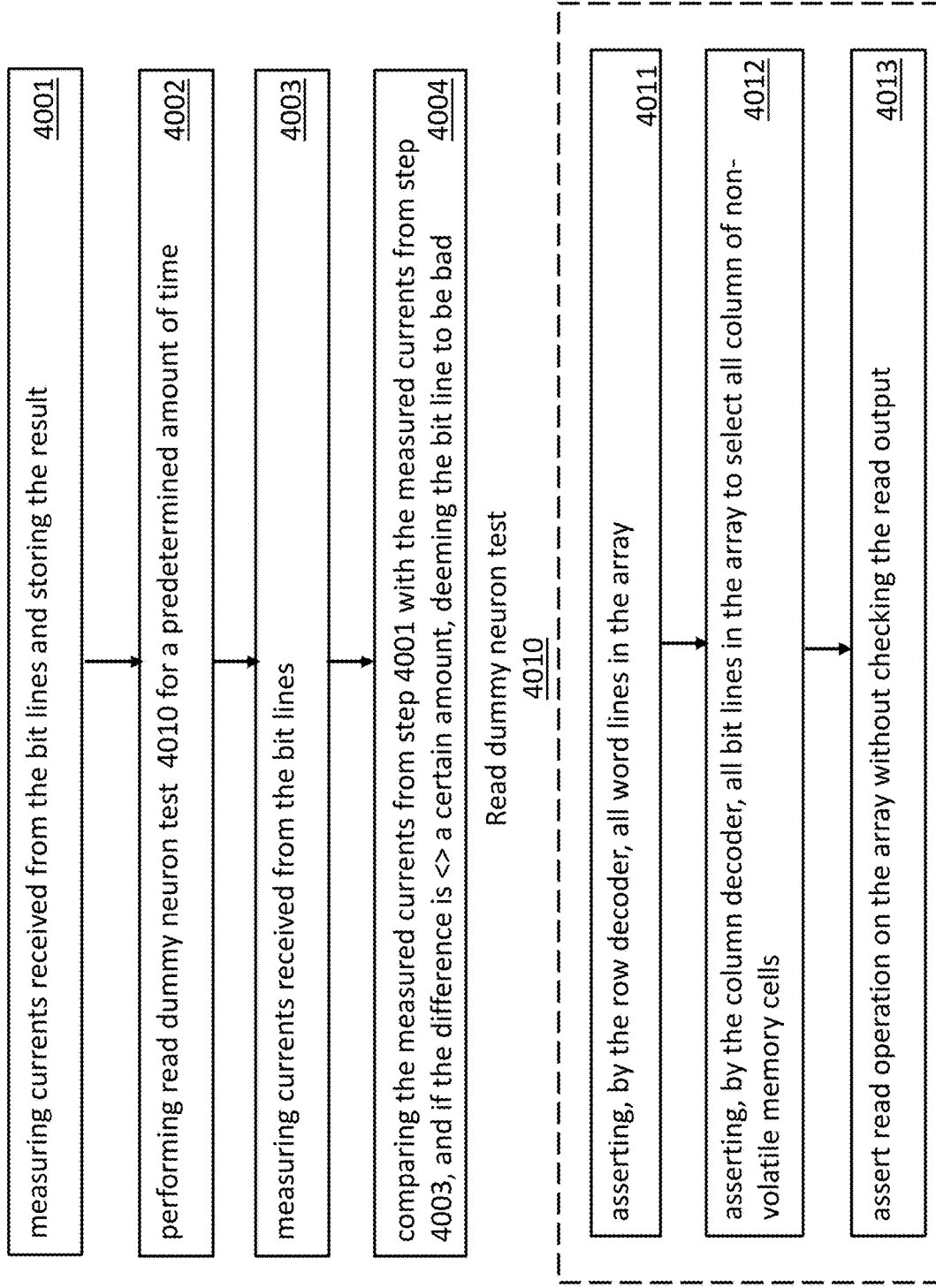
FIG. 40 depicts an embodiment of a read neuron qualification test.

With reference to FIG. 40, during read neuron qualification test 3110, a neuron (bit line) is read without checking the value against a desired value. The first step is measuring currents in the bitlines and storing the measured values (step 4001). The second step is performing the read dummy neuron test 4010, to be described below, for a pre-determined amount of time, such as the burn-in time during the qualification process. The third step is measuring currents from the bitlines (step 4003). The fourth step is comparing the measured currents to the stored measured currents from step 4001 (step 4004). If the difference is more than or less than a certain amount, then the bitline is deemed to be a bad bitline.

Read dummy neuron test 4010 comprises a series of steps. The first step is asserting, by the row decoder, all word lines in the array (step 4011). The second step is asserting, by the column decoder, all bit lines in the array to select all column of non-volatile memory cells (step 4012). The third step is performing a read operation (read condition) on the array without checking the read output (step 4013). The read dummy neuron test 4010 is used as a read stress on the array for burn-in purposes.

Figure 41:
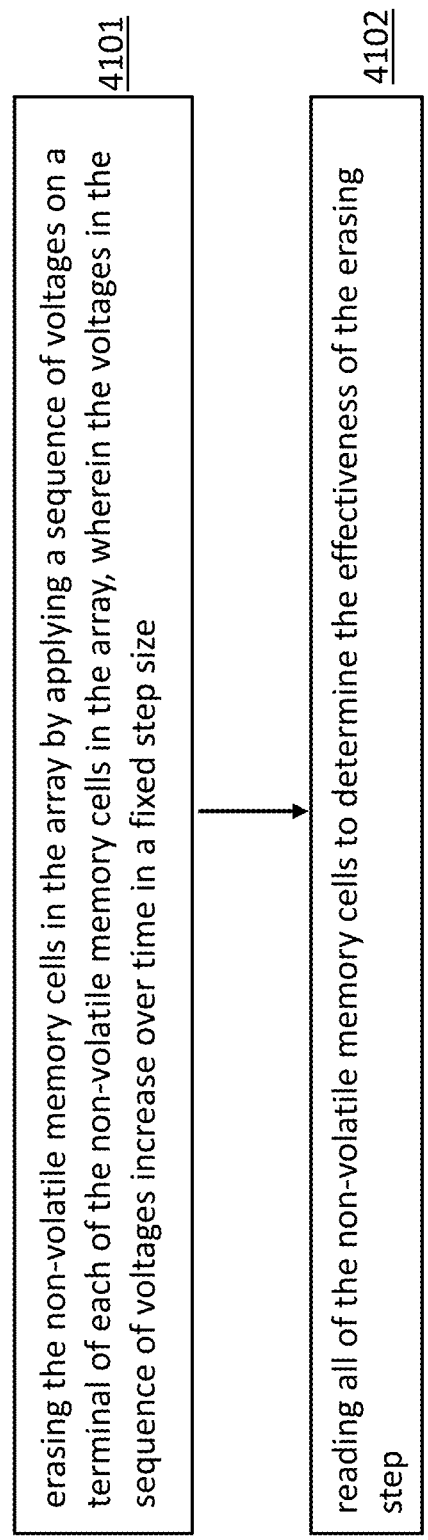
FIG. 41 depicts an embodiment of a soft erase test.

With reference to FIG. 41, during soft erase test 3111, the entire array or a sector is tested to check for erase performance of the memory array. The first step is erasing the non-volatile memory cells in the array by applying a sequence of voltages on a terminal of each of the non-volatile memory cells in the array, wherein the voltages in the sequence of voltages increase over time in a fixed step size (step 4101). This erases the cells in an incremental manner, for example, by increasing the voltage on erase gates in a stepped manner between 5-12.5 volts in steps of for example 0.5 or 1 volts. Erasing in this manner reduces stress on the memory cells. The second step is reading all of the non-volatile memory cells to determine the effectiveness of the erasing step (step 4102), for example by determining that the cell current after the erasing of step 4101 is within an acceptable window around a nominal value. Optionally, endurance testing can be performed to determine how many program/erase cycles can be sustained, or background testing can be performed to cause the array to transition into an erased state.

With reference to FIG. 42, during soft program test 3112, the entire array or a row or cell is tested. The first step is programming the non-volatile memory cells in the array by applying a sequence of voltages on a terminal of each non-volatile memory cell in the array, wherein the voltages in the sequence of voltages increase over time in a fixed step size (step 4201). The cells are programmed in an incremental manner, for example, between 3-10 volts in 10 mV or 0.3 V or 1 V steps to check for program performance of the memory array. Programming in this manner reduces stress on the memory cells. The second step is reading all of the non-volatile memory cells to determine the effectiveness of the programming step (step 4202)), for example by determining that the cell current after the programming of step 4201 is within an acceptable window around a nominal value. Optionally, endurance testing or background testing can be utilized.

With reference to FIG. 43, read verification test 3106 can be performed. The first step is programming a plurality of the non-volatile memory cells to store one of N different values, where N is the number of different levels that can be stored in any of the non-volatile memory cells (step 4301). The second step is measuring a current drawn by the plurality of non-volatile memory cells (step 4302). The third step is comparing the measured current to a target value (step 4303). The fourth step is storing the identifying the plurality of the non-volatile memory cells as bad if the difference between the measured value and the target value exceeds a threshold factor (step 4304).

With reference to FIG. 44, checkerboard verification test 3113 can be performed, whereby a test pattern is implemented using a checkerboard or pseudo-checkerboard pattern and sampled levels, rather than all possible levels, (e.g. 4 levels, L0, Ln, Ln/4, Ln*3/4 instead of all N levels), are measured. For example, a pattern can be used to check for the worst-case electric field stress (meaning one cell is at a high electric field level and an adjacent cell is at low electric field level) within the memory array.

In one embodiment, the first step is programming a first group of cells among the plurality of non-volatile memory cells with a level corresponding to the smallest cell current among the N levels (step 4401). The second step is programming a second group of cells among the plurality of non-volatile memory cells with a level corresponding to the largest cell current among the N levels (step 4402) Each of the cells in the second group of cells is adjacent one or more of the cells in the first group of cells. The third step is measuring a current drawn by the plurality of non-volatile memory cells (step 4403). The fourth step is comparing the measured current to a target value (step 4404). The fifth step is identifying the plurality of the non-volatile memory cells as bad if the difference between the measured value and the target value exceeds a threshold (step 4405).

Table No. 10 contains other exemplary test patterns of a physical array map that can be used during checkerboard verification test 3113:

TABLE NO. 10

| Exemplary Test Patterns | | | |
|---|---|---|---|
| Pattern 1: | | | |
| Ldeep | Ln | Ldeep | Ln |
| Ln | Ldeep | Ln | Ldeep |
| Ldeep | Ln | Ldeep | Ln |
| Ln | Ldeep | Ln | Ldeep |
| Pattern 2: | | | |
| Ldeep | Lm | Ldeep | Lm |
| Lm | Ldeep | Lm | Ldeep |
| Ldeep | Lm | Ldeep | Lm |
| Lm | Ldeep | Lm | Ldeep |
| Pattern 3: | | | |
| L0 | Ln | L0 | Ln |
| Ln | L0 | Ln | L0 |
| L0 | Ln | L0 | Ln |
| Ln | L0 | Ln | L0 |
| Pattern 4: | | | |
| L0 | Lq | Lm | Ln |
| Ln | L0 | Lq | Lm |
| Lm | Ln | L0 | Lq |
| Lq | Lm | Ln | L0 |

Sort test 3114, final test 3115, qualification test 3116, and data retention test 3117 are test suites that can be performed during the manufacturing and qualification process of a wafer, die, or packaged device containing a VMM system disclosed herein.

Sort test 3114 can be performed on a wafer during the manufacturing process. In one embodiment, sort test 3114 comprises the following test suite: First, relatively fasts tests are performed to quickly identify bad wafers or die, such as soft erase test 3111, soft program test 3112, and various stress mode tests (such as erase gate oxide gox, coupling gate oxide cox, source line oxide sol, reverse disturb tunneling rtsts (tunneling from floating gate to wordline, disturb on un-selected rows), mass punchthrough mpt (disturb from source to drain of un-selected rows), read disturb rdist (disturb from read condition)). Second, neural test modes such as LSB screen test 3103 and bitline sampling screen 3104 for top and bottom sectors are performed. Neural testmodes are much more time consuming than the testing performed during the first step, and some time is saved due to bad wafers or die being screened identified during the first set of less time-consuming tests.

Final test 3115 can be performed on a packaged device. In one embodiment, final test 3115 comprises the performance of soft erase test 3111 and soft program test 3112. Optionally, test patterns for neural application can be utilized to reduce test time rather than comprehensive testing, such as testing K of N levels of M sectors, or testing all N levels for certain sectors (such as the top and bottom sectors).

During qualification test 3116, dummy bitline read cycling (which is the performance of a read action without actually determining the content of the read data) is performed and endurance testing is done by applying soft erase test 3111 and soft program test 3112. Bitline tests are performed, instead of individual memory cell tests, since bitline reads are used instead of individual memory reads during neural memory applications.

Data retention test 3117 can comprise, for example, baking a programmed wafer at an elevated temperature such as 250 degrees C. for 24-72 hours. In one embodiment, a checkerboard or pseudo-checkerboard test pattern is imposed, rather than comprehensive testing as for digital memory test. Data retention is checked on the bitline current in the neural mode (instead of each memory cell as done for a digital memory) with read bitline current mode. For example, one inquiry is to check if delta IBL<+/−p %, where delta IBL is defined as the difference of the measured bit line current from the expected bit line current. (WholeBLmeas mode, percentage error p % allowed from software neural net modeling for a target accuracy for a neural network). Delta IBL is tested for neural mode to identify if bitline output current exceeds or goes below a target, defined herein as a predetermined percentage "p" of the target. Alternatively, each cell can be checked/tested with a +/−delta of the target.

Other testing can be performed using the hardware and algorithms described herein.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method of testing an array of analog neural non-volatile memory cells, wherein the array is arranged in rows and columns, wherein each row is coupled to a word line and each column is coupled to a bitline, the method comprising:
    programming a plurality of cells coupled to a bitline;
    measuring, K different times, a current drawn by the plurality of cells and storing a measured value each of the K different times, where K is an integer;
    calculating an average value based on the K measured values; and
    identifying the bitline as a bad bitline if any of the K measured values is less than the average value by more than a first threshold or is more than the average value by more than a second threshold.

2. The method of claim 1, wherein each of the non-volatile memory cells is a stacked-gate flash memory cell.

3. The method of claim 1, wherein each of the non-volatile memory cells is a split-gate flash memory cell.

4. The method of claim 1, wherein the array is part of a neural network.

5. A method of testing an array of analog neural nonvolatile memory cells, wherein the array is arranged in rows and columns, wherein each row is coupled to a word line and each column is coupled to a bitline, the method comprising:
- programming a plurality of cells coupled to a bitline;
- measuring, K different times, a voltage on a control gate line coupled to a control gate terminal of a plurality of cells and storing a measured value each of the K different times, where K is an integer;
- calculating an average value based on the K measured values; and
- identifying the bitline as a bad bitline if any of the K measured values is less than the average value by more than a first threshold or is more than the average value by more than a second threshold.

6. The method of claim 5, wherein each of the non-volatile memory cells is a stacked-gate flash memory cell.

7. The method of claim 5, wherein each of the non-volatile memory cells is a split-gate flash memory cell.

8. The method of claim 5, wherein the array is part of a neural network.

\* \* \* \* \*